US011121278B2

(12) United States Patent
Escarra et al.

(10) Patent No.: US 11,121,278 B2
(45) Date of Patent: Sep. 14, 2021

(54) INFRARED TRANSMISSIVE CONCENTRATED PHOTOVOLTAICS FOR COUPLING SOLAR ELECTRIC ENERGY CONVERSION TO SOLAR THERMAL ENERGY UTILIZATION

(71) Applicant: The Administrators of the Tulane Educational Fund, New Orleans, LA (US)

(72) Inventors: Matthew David Escarra, New Orleans, LA (US); Benjamin Lewson, New Orleans, LA (US); Yaping Ji, New Orleans, LA (US); Qi Xu, New Orleans, LA (US); Adam Ollanik, Boulder, CO (US)

(73) Assignee: THE ADMINISTRATORS OF THE TULANE EDUCATIONAL FUND, New Orleans, LA (US)

( * ) Notice: Subject to any disclaimer, the term of this patent is extended or adjusted under 35 U.S.C. 154(b) by 329 days.

(21) Appl. No.: 15/322,417

(22) PCT Filed: Jun. 29, 2015

(86) PCT No.: PCT/US2015/038396
§ 371 (c)(1),
(2) Date: Dec. 27, 2016

(87) PCT Pub. No.: WO2015/200927
PCT Pub. Date: Dec. 30, 2015

(65) Prior Publication Data
US 2018/0212091 A1    Jul. 26, 2018

Related U.S. Application Data

(60) Provisional application No. 62/018,332, filed on Jun. 27, 2014.

(51) Int. Cl.
*H01L 31/0687* (2012.01)
*H01L 31/048* (2014.01)
(Continued)

(52) U.S. Cl.
CPC ...... *H01L 31/0687* (2013.01); *H01L 31/0201* (2013.01); *H01L 31/02168* (2013.01);
(Continued)

(58) Field of Classification Search
CPC ... H01L 31/042; H01L 31/043; H01L 31/047; H01L 31/0687; H01L 31/0684;
(Continued)

(56) References Cited

U.S. PATENT DOCUMENTS 5,273,911 A * 12/1993 Sasaki ................. C23C 14/568
136/244
6,340,788 B1 * 1/2002 King .................... H01J 37/3023
136/255
(Continued)

FOREIGN PATENT DOCUMENTS

WO    WO 2012/076847 A1    6/2012

OTHER PUBLICATIONS

International Search Report and Written Opinion of PCTUS2015/038396 dated Sep. 24, 2015, 11 pp.
(Continued)

*Primary Examiner* — Daniel P Malley, Jr.
(74) *Attorney, Agent, or Firm* — Lathrop GPM LLP

(57) ABSTRACT

The use of photovoltaic (PV) cells to convert solar energy to electricity is becoming increasingly prevalent; however, there are still significant limitations associated with the widespread adoption of PV cells for electricity needs. There is a clear need for a high efficiency solar power system that supplies electricity at a competitive cost and that provides for an on-demand supply of electricity as well as energy
(Continued)

storage. By combining aspects of concentrated solar power and concentrated photovoltaics, the present invention provides a device that enables the conversion of sunlight to electricity at very high efficiencies and that enables the transmission of thermal energy to heat storage devices for later use. The disclosed device enables transmissive CPV through the use of a multijunction PV cell mounted on a transparent base. The use of a multijunction cell allows for highly efficient absorption of light above the bandgap of the lowest bandgap subcell. The transparent base permits transmission of a high percentage of the remaining light below the bandgap of the lowest bandgap subcell. The present invention also discloses a method of generating electricity through the use of a transmissive CPV device. Sunlight is concentrated onto one or more surfaces of the device. High energy light is absorbed by a multijunction PV cell and converted directly to electricity, while low energy light is transmitted through the device into a thermal storage device, which may then be coupled to a heat engine to generate dispatchable electricity.

20 Claims, 21 Drawing Sheets

(51) Int. Cl.
H01L 31/0693 (2012.01)
H01L 31/054 (2014.01)
H01L 31/042 (2014.01)
H02S 40/44 (2014.01)
H01L 31/02 (2006.01)
H01L 31/0216 (2014.01)
H01L 31/052 (2014.01)

(52) U.S. Cl.
CPC .......... H01L 31/042 (2013.01); H01L 31/048 (2013.01); H01L 31/0488 (2013.01); H01L 31/0521 (2013.01); H01L 31/0547 (2014.12); H01L 31/0693 (2013.01); H02S 40/44 (2014.12); Y02E 10/52 (2013.01); Y02E 10/544 (2013.01); Y02E 10/60 (2013.01)

(58) Field of Classification Search
CPC .......... H01L 31/06875; H01L 31/0725; H01L 31/0735; H01L 31/076; H01L 31/0547; H01L 31/054; H01L 31/101; H01L 31/048; H01L 31/0488; H01L 31/0521; H01L 31/0543; Y02E 10/52; Y02E 10/544; Y02E 10/60; H02S 10/30; H02S 20/32; H02S 40/40; H02S 40/42; H02S 40/425; H02S 40/44
See application file for complete search history.

(56) References Cited

U.S. PATENT DOCUMENTS

| | | | |
|---|---|---|---|
| 7,745,723 B2 * | 6/2010 | Dyson | G02B 3/08 136/246 |
| 8,772,628 B2 * | 7/2014 | Wanlass | H01L 31/06875 136/255 |
| 2002/0117675 A1 | 8/2002 | Mascarenhas | |
| 2005/0161074 A1 * | 7/2005 | Garvison | F24S 25/40 136/246 |
| 2006/0162768 A1 | 7/2006 | Wanlass et al. | |
| 2008/0135087 A1 | 6/2008 | Anikara | |
| 2008/0314436 A1 * | 12/2008 | O'Connell | H01L 31/0543 136/246 |
| 2009/0146049 A1 | 6/2009 | Hsieh et al. | |
| 2010/0059097 A1 * | 3/2010 | McDonald | H01L 31/0547 136/244 |
| 2010/0186804 A1 * | 7/2010 | Cornfeld | H01L 31/02021 136/255 |
| 2010/0229908 A1 | 9/2010 | Van Steenwyk et al. | |
| 2010/0229913 A1 | 9/2010 | Cornfeld | |
| 2010/0294264 A1 | 11/2010 | Link | |
| 2011/0315188 A1 * | 12/2011 | Hong | H01L 31/0512 136/244 |
| 2012/0006383 A1 | 1/2012 | Donnelly | |
| 2012/0024365 A1 * | 2/2012 | Branz | H01L 31/02168 136/256 |
| 2012/0138047 A1 | 6/2012 | Ashkin | |
| 2012/0174582 A1 * | 7/2012 | Moussavi | F22B 1/006 60/641.8 |
| 2012/0186623 A1 | 7/2012 | Bulovic et al. | |
| 2012/0273030 A1 * | 11/2012 | Jee | H01L 31/0488 136/251 |
| 2012/0312351 A1 | 12/2012 | Knox | |
| 2013/0014813 A1 | 1/2013 | Wang et al. | |
| 2013/0270589 A1 * | 10/2013 | Kayes | H01L 31/02168 257/95 |
| 2014/0060613 A1 | 3/2014 | So et al. | |
| 2014/0083481 A1 * | 3/2014 | Hebrink | H02S 20/26 136/246 |
| 2014/0261636 A1 * | 9/2014 | Anderson | H02J 7/0042 136/251 |
| 2015/0083192 A1 * | 3/2015 | Nobori | H01L 31/0687 136/246 |
| 2015/0372640 A1 * | 12/2015 | Yang | F24S 30/425 136/248 |
| 2016/0341498 A1 | 11/2016 | Lynn et al. | |
| 2018/0108794 A1 * | 4/2018 | Aiken | H01L 31/041 |
| 2018/0138352 A1 * | 5/2018 | Aiken | H01L 31/184 |

OTHER PUBLICATIONS

Extended European Search Report of EP 15811185.6 dated Feb. 27, 2018, 8 pp.
Australian Patent Application No. 2015279582; Examination Report No. 1 dated Dec. 5, 2019; 3 pages.
U.S. Appl. No. 16/497,699; Office Action dated Apr. 15, 2021; 17 pgs.
Australian Patent Application No. 2015279582; Examination Report dated Nov. 26, 2020; 4 pgs.
Australian Patent Application No. 2015279582; Examination Report dated Nov. 17, 2020; 4 pgs.

* cited by examiner

FIG. 6
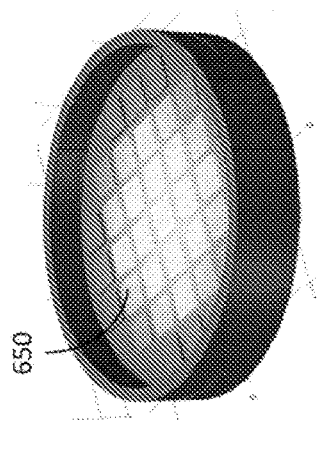
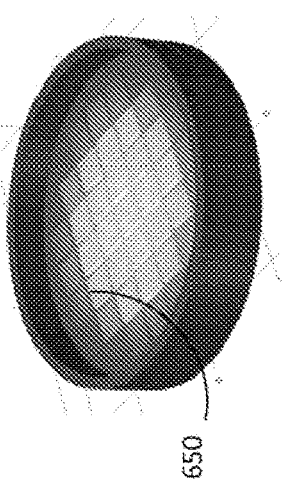
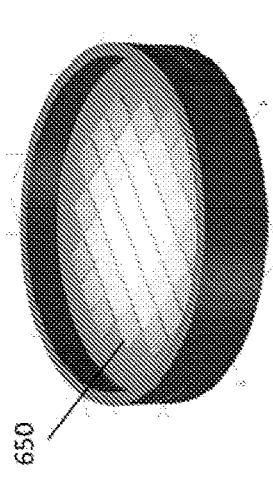
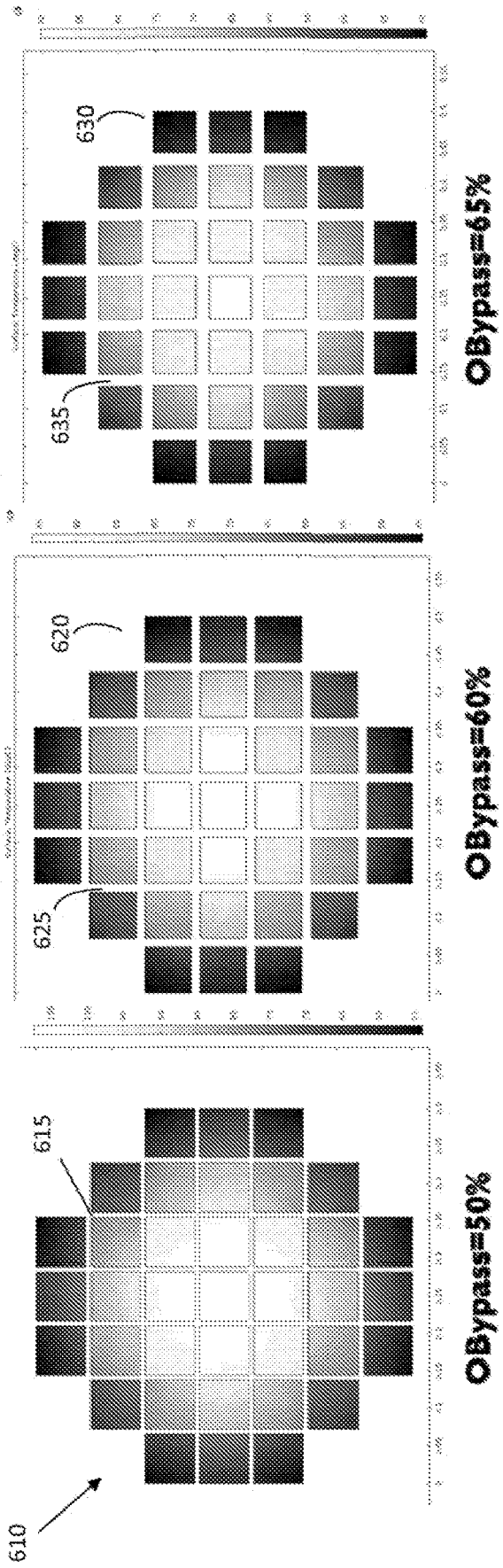

FIG. 7
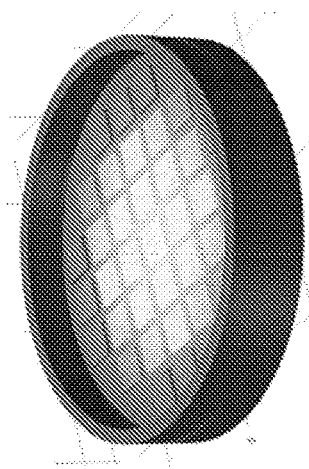
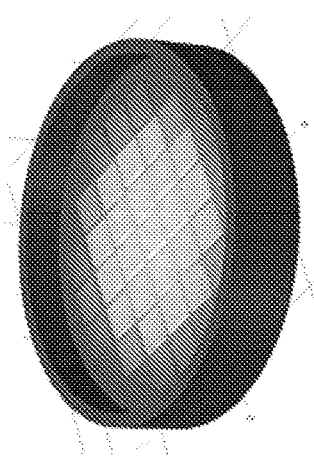
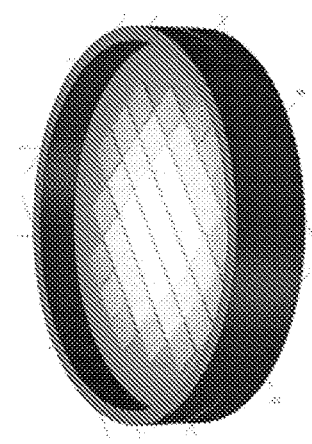
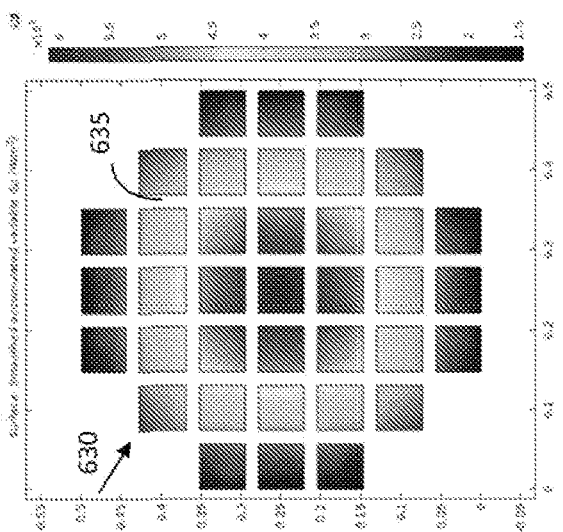
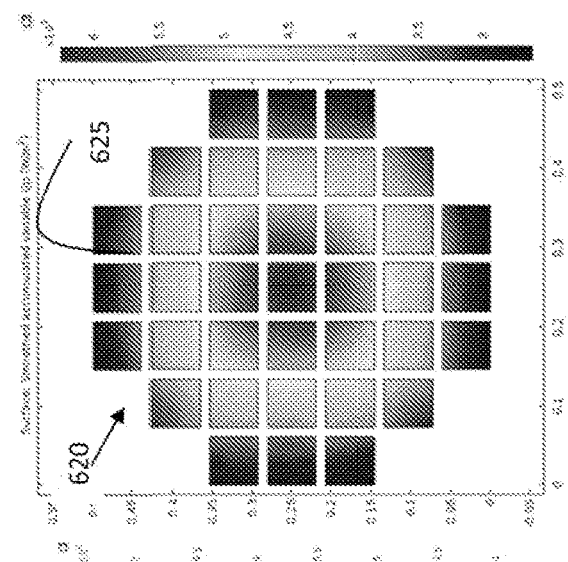
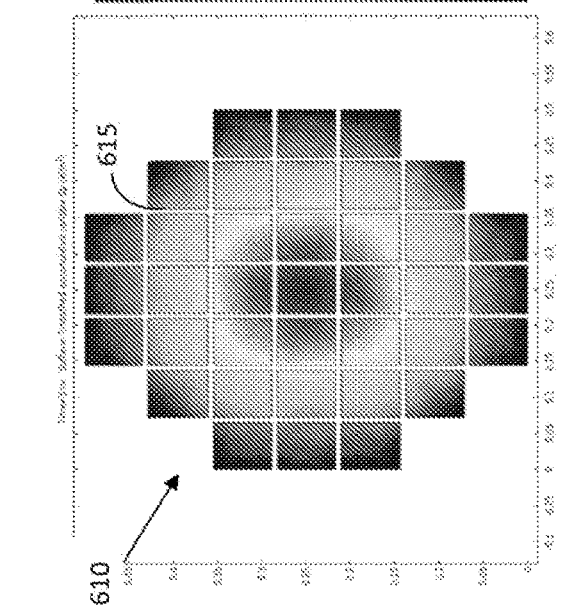

FIG. 8
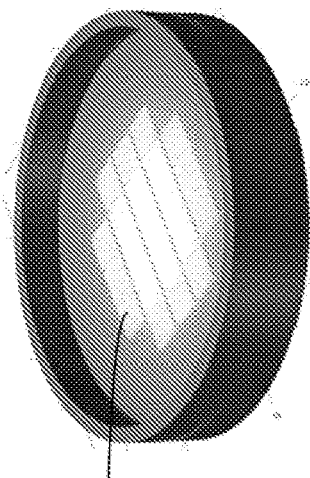
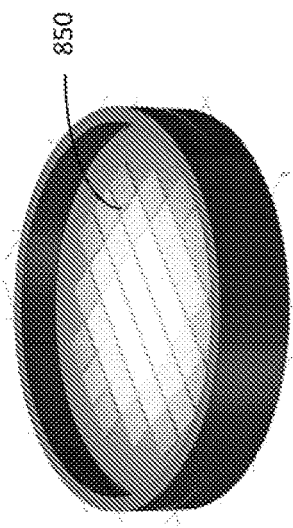
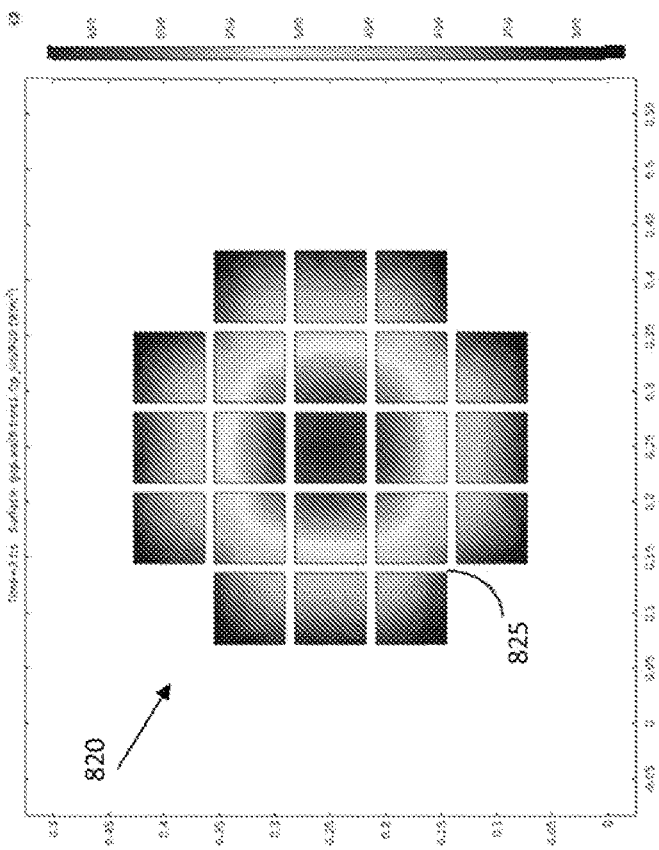
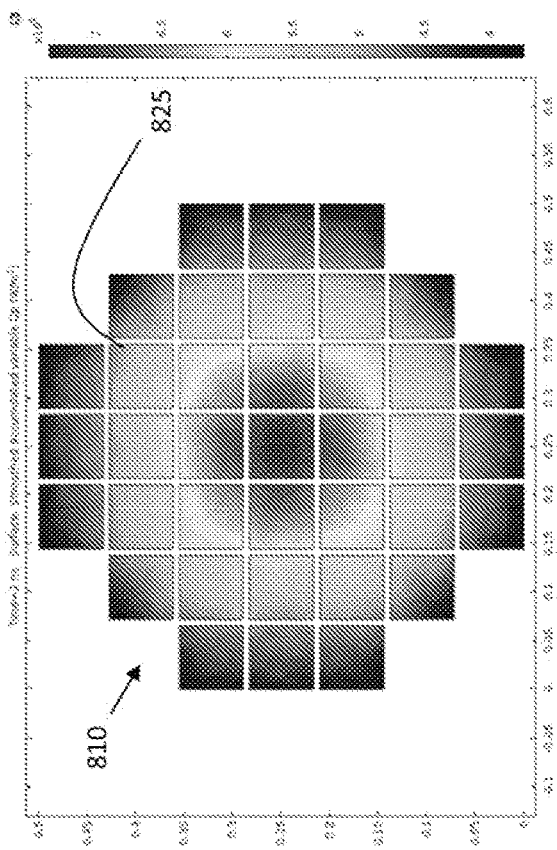

FIG. 9
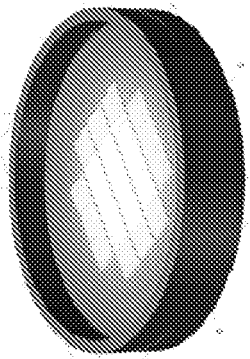
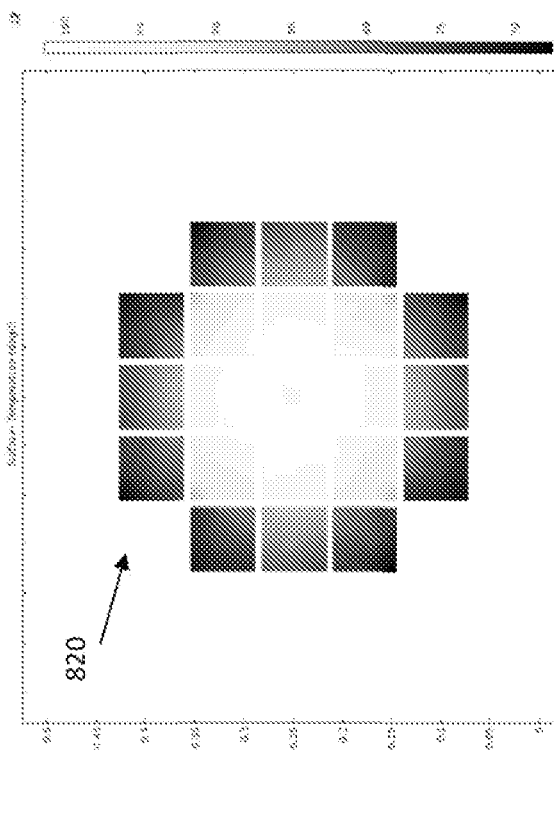
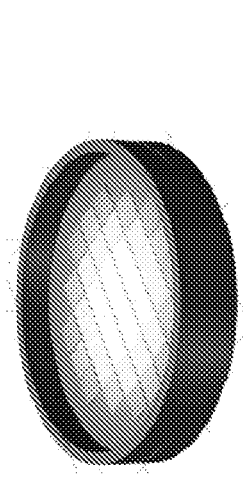
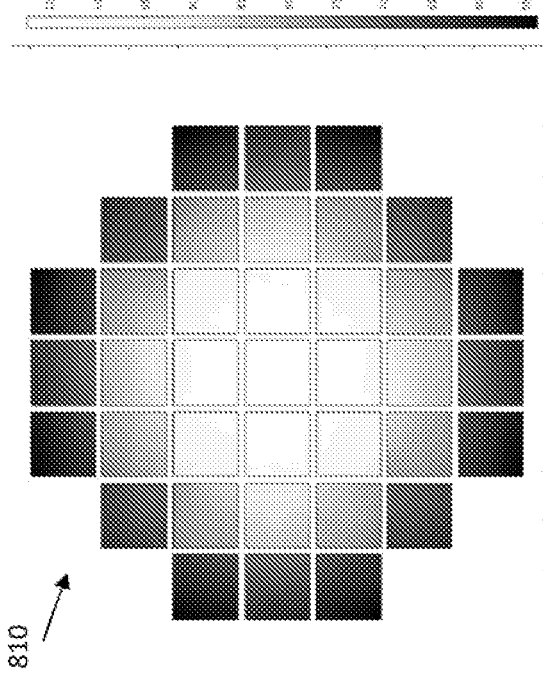

INFRARED TRANSMISSIVE CONCENTRATED PHOTOVOLTAICS FOR COUPLING SOLAR ELECTRIC ENERGY CONVERSION TO SOLAR THERMAL ENERGY UTILIZATION

CROSS-REFERENCES TO RELATED APPLICATIONS

This application claims priority from U.S. Provisional Application No. 62/018,332, filed Jun. 27, 2014, which is incorporated herein by reference as if set forth in full below.

STATEMENT REGARDING FEDERALLY SPONSORED RESEARCH

The invention was made with U.S. Government support from the United States Department of Energy, Advanced Research Projects Agency-Energy, under contract number DE-AR0000473. The United States Government has certain rights in the invention.

BACKGROUND OF THE INVENTION

I. Field

The present invention relates to a novel high-efficiency, scalable device for splitting the solar spectrum, converting some solar energy to electricity and coupling other solar energy to a solar thermal energy conversion and/or storage system and a method for converting some solar energy to electricity at high efficiencies while coupling other solar energy to a solar thermal energy conversion and/or storage system.

II. Background

The use of photovoltaic (PV) cells to convert solar energy to electricity is becoming increasingly prevalent; however, there are still significant limitations associated with the widespread adoption of PV cells for electricity needs. In order to provide for greater implementation of solar power at the utility scale, systems and devices with higher efficiencies are needed. High efficiency PV cells must also be low cost and scalable to neighborhood-sized arrays or utility-scale plants. Due to the intermittent nature of sunlight and photovoltaic power, PV must be designed to work in tandem with other energy conversion technologies that allow for energy storage and dispatchable energy production.

One strategy to produce high efficiency solar cells is to maximize the spectral overlap between the optical absorption of a cell and the incoming light. Multijunction PV cells show great promise in this respect, as stacking of multiple PV cells with different band gap energies permits more of the solar spectrum to be collected by a single device. It has been reported that the use of monolithically integrated III-V semiconductors has resulted in efficiencies greater than 40% in concentrated sunlight. However, the cost of fabrication remains quite high, which will delay mass production and large scale installation of multijunction PV cells for uses beyond space applications, such as for power plants.

Another limitation of generating electricity from solar power is the ability to provide sufficient electricity on demand. Storage of electricity from solar power has been limited by available battery technology and by the ability of home-scale solar power generators to connect to the grid. Existing solutions addressing the ability of solar-generated electricity to be stored for later use and dispatched on demand are currently not cost-competitive with fossil fuel-generated electricity.

Concentrated solar power (CSP) takes a different approach from PV cells in that CSP systems concentrate sunlight and convert it to heat, which drives a heat engine. Given the current levelized cost of energy (LCOE) of around $0.21/kWh, even state-of-the-art CSP is a high cost and consequently unviable energy solution for widespread deployment. Existing CSP projects demonstrate the technical feasibility of CSP but fail to deliver the low costs required for solar thermal power to be a viable and widely used source of energy. Building a CSP plant involves an extremely high capital cost of currently approximately $3 billion, which prohibits the incorporation of unproven technologies and is prohibitive from the point of view of a developer.

In order for CSP to become a viable option for solar power generation, two aspects must be addressed. The cost of the overall system must be reduced to be competitive with or cheaper than PV. However, to truly compete, the cost of a CSP system needs to have an LCOE matching that of natural gas or coal. Additionally, the cost to construct a CSP plant must be on the order of millions instead of billions of dollars. Preferably, this will be accomplished with a scalable field size, which would enable iterations of successful fields culminating in large-scale grid deployments.

Concentrated photovoltaic (CPV) systems use lenses, curved mirrors, or other optical instruments to concentrate sunlight onto PV cells to generate electricity. Because light is concentrated onto a small area of PV cells, CPV systems are generally more cost-effective than non-concentrated photovoltaics when using expensive cell materials. However, there are additional costs for optical instrumentation to concentrate the light and for cooling systems to dissipate the high temperatures associated with concentrated light. Due to these costs, CPV is not as widespread as non-concentrated PV systems based on cheaper cell materials such as silicon.

There is a clear need for a high efficiency solar power system that supplies electricity at a competitive cost and that provides for an on-demand supply of electricity as well as storage. By combining aspects of CSP and CPV, the present invention provides a device that enables the conversion of sunlight to electricity at very high efficiencies and that enables the transmission of solar thermal energy to heat storage devices for later use, all at costs that (we speculate) are projected to compete with alternative technologies such as PV-plus-batteries. The stored thermal energy can be used to generate dispatchable electricity or for other purposes where heat is required, such as industrial processes, desalinization, home water heating, etc.

The present invention discloses a device enabling transmissive CPV through the use of a multijunction PV cell mounted on a transparent base (or substrate). The use of a multijunction cell allows for highly efficient absorption of light above the bandgap of the lowest bandgap subcell. The transparent base permits transmission of a high percentage of the remaining light below the bandgap of the lowest bandgap subcell, also referred to as out-of-band light. The present invention also discloses a method of generating electricity through the use of a transmissive CPV device. Sunlight is concentrated onto one or more surfaces of the device. High energy light is absorbed by a multijunction PV cell, while low energy light is transmitted through the device into a storage device.

While certain novel features of this invention shown and described below are pointed out in the annexed claims, the invention is not intended to be limited to the details specified, since a person of ordinary skill in the relevant art will understand that various omissions, modifications, substitutions and changes in the forms and details of the invention illustrated and in its operation may be made without departing in any way from the spirit of the present invention. No feature of the invention is critical or essential unless it is expressly stated as being "critical" or "essential."

SUMMARY OF THE INVENTION

The present invention provides a concentrated photovoltaic device that absorbs high energy light and transmits low energy light.

In accordance with this discovery, it is an object of the invention to provide a CPV module with the ability to enable both the immediate generation of electricity from light and the storage of energy from light for later conversion to electricity or use as heat.

It is an additional object of this invention to provide a method of generating electricity through the use of a transmissive CPV module.

Other objects and advantages of this invention will become readily apparent from the ensuing description.

BRIEF DESCRIPTION OF THE DRAWINGS

The following drawings form part of the present specification and are included to further demonstrate certain aspects of the present invention. The invention may be better understood by reference to one or more of these drawings in combination with the description of specific embodiments presented herein.

FIG. 6 shows three CPV modules with multijunction array elements, where the degree of shading is indicative of the relative temperate of each array element.

FIG. 7 shows the CPV modules shown in FIG. 6, but with light intensity plots replacing temperature plots.

FIG. 8 shows two variations of a CPV module, each having 37 multijunction array elements and 21 multijunction array elements, respectively.

FIG. 9 shows the same modules as FIG. 8, but the light intensity plots have been replaced by temperature plots showing the relative temperature of each array element.

DETAILED DESCRIPTION OF THE INVENTION

Detailed descriptions of one or more preferred embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in any appropriate manner.

Wherever any of the phrases "for example," "such as," "including" and the like are used herein, the phrase "and without limitation" is understood to follow unless explicitly stated otherwise. Similarly "an example," "exemplary" and the like are understood to be non-limiting.

The term "substantially" allows for deviations from the descriptor that do not negatively impact the intended purpose. Descriptive terms are understood to be modified by the term "substantially" even if the word "substantially" is not explicitly recited. Therefore, for example, the phrase "wherein the lever extends vertically" means "wherein the lever extends substantially vertically" so long as a precise vertical arrangement is not necessary for the lever to perform its function.

The terms "comprising" and "including" and "having" and "involving" (and similarly "comprises", "includes," "has," and "involves") and the like are used interchangeably and have the same meaning. Specifically, each of the terms is defined consistent with the common United States patent law definition of "comprising" and is therefore interpreted to be an open term meaning "at least the following," and is also interpreted not to exclude additional features, limitations, aspects, etc. Thus, for example, "a process involving steps a, b, and c" means that the process includes at least steps a, b and c. Wherever the terms "a" or "an" are used, "one or more" is understood, unless such interpretation is nonsensical in context.

For the purposes of this application, where the term "CPV module" is used, unless a specific reference number is used, such term refers equally to the general category of "CPV modules" described herein, including without limitation, CPV modules 100, 101, 103, 220, 310, 510, 1310, 1410, 1510, 1810, 2010 and 2118, or any other similar devices described herein. Moreover, the terms "CPV module" and "transmissive CPV module" are interchangeable.

Figure 16:
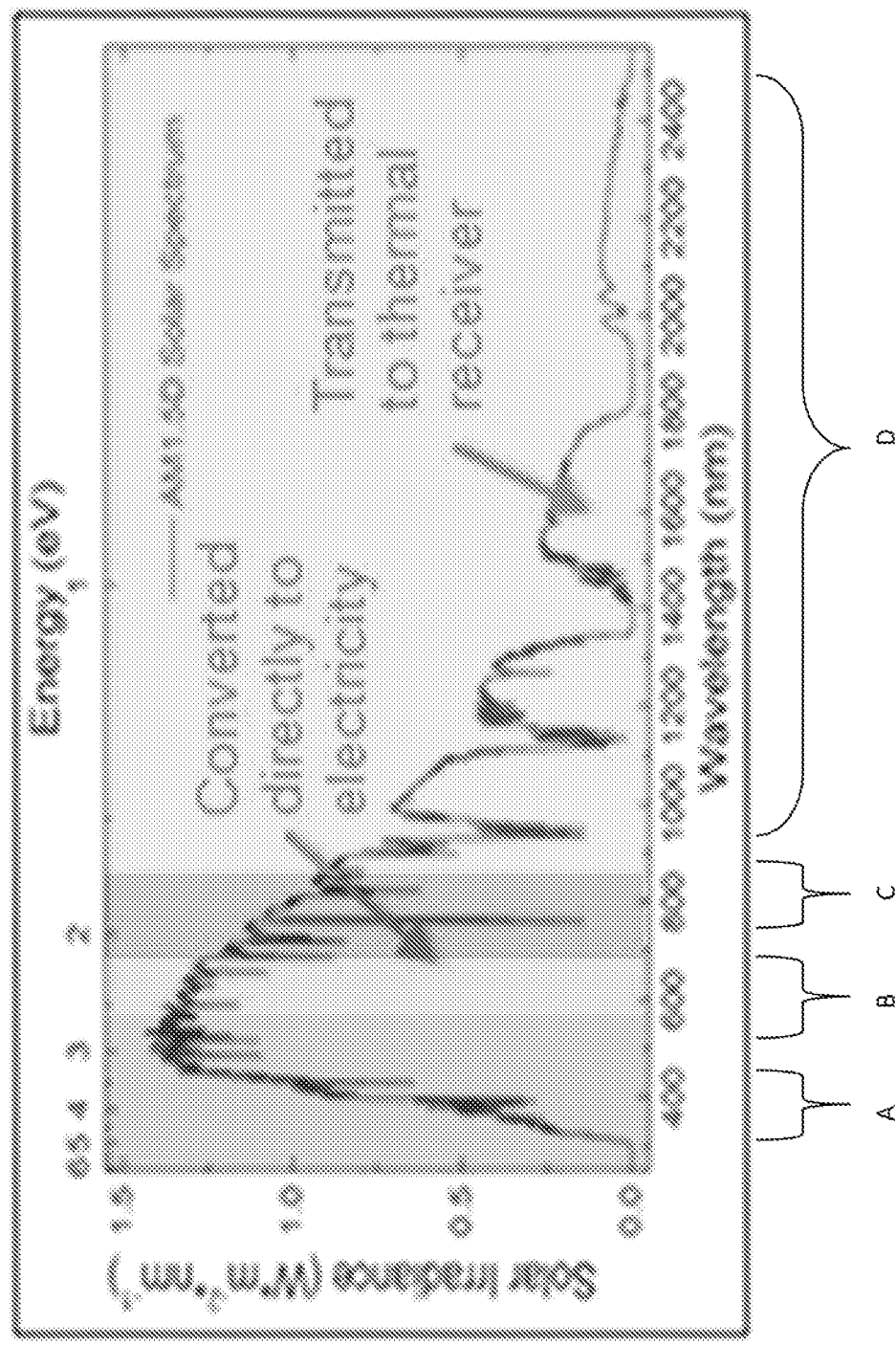
FIG. 16 shows a graph of energy absorbed by a multijunction PV cell with three subcells, where band A, B, and C correspond to said three subcells and band D corresponds to energy transmitted to thermal receiver behind said PV cell.

In one embodiment (not shown), the present invention provides a multijunction PV cell with at least two subcells of different bandgaps. Bandgaps for each subcell may range from about 1.4 eV to about 2.3 eV or may be outside this preferred range. In another embodiment, shown in FIG. 1A, the CPV module 100 is comprised of multijunction PV 105 which comprises three subcells 110, 120 and 130, with bandgaps of about 2.20 eV, about 1.80 eV and about 1.51 eV, respectively. FIG. 16 shows a graph of energy absorbed by a multijunction PV cell with three subcells (such as multijunction PV cell 105), where bands A, B, and C correspond to subcells 110, 120 and 130, respectively, and band D corresponds to energy transmitted to thermal receiver behind said CPV module 100. Each subcell 110, 120 and 130 is constructed with type III-V materials, which are generally known as the highest efficiency materials used in PV cells. Alternatively, each subcell (making up PV cell 105) may be constructed with any suitable material. In one embodiment, subcell 110 is constructed from AlGaInP, subcell 120 is constructed from InGaP, and subcell 130 is constructed from AlGaAs. In one embodiment, materials for each subcell are lattice-matched to gallium arsenide or germanium substrates. In other embodiments, materials for each subcell may be lattice-mismatched or metamorphic.

Figure 1A:
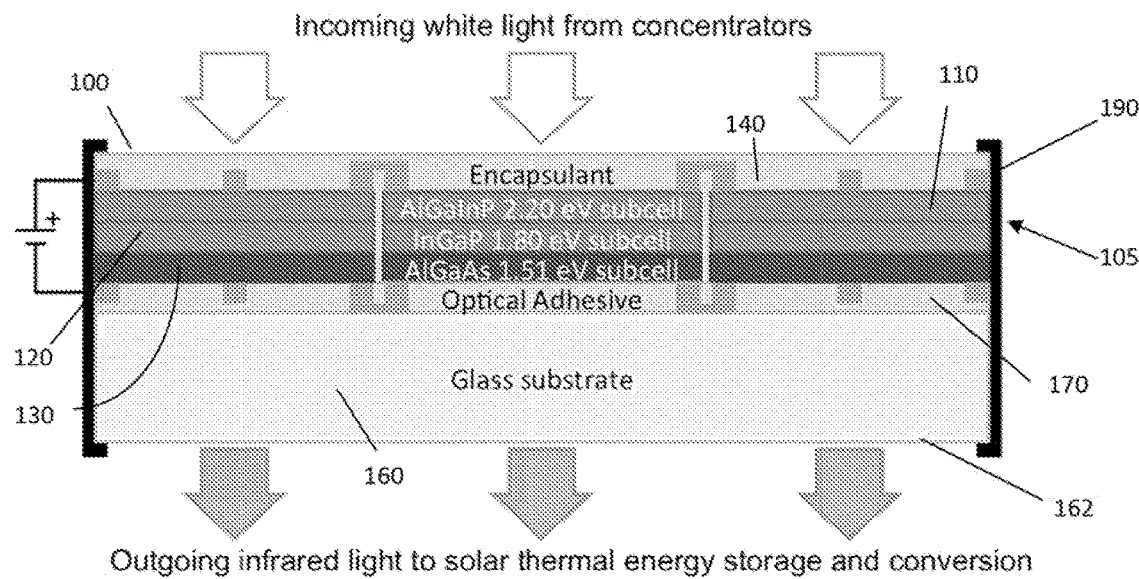
FIG. 1A shows one embodiment of a CPV module.

In some embodiments, the present invention includes one or more encapsulant materials 140 positioned above and/or below the multijunction PV 105 (see, e.g., FIGS. 1A and 1B). In one embodiment, the one or more encapsulant materials are used in tandem with an anti-reflection coating, such as coatings 150a, 150b, 150c and 150d (collectively referred to as anti-reflection coating 150), where: 150a is applied at the junction between the atmosphere and the outer surface of superstrate 180; 150b is applied at the junction between encapsulant 140 and PV cell 105; 150c is applied at the junction between encapsulant 140 and substrate 160; and, 150d is applied at the junction between the atmosphere and the outer surface of substrate 160. Exemplary materials used for anti-reflection coating 150a include: (1) Al2O3 in a thickness of 85 nm with MgF2 in a thickness of 110 nm; (2) MgF2 in a thickness of 110 nm; and, (3) Al2O3 in a thickness of 85 nam with SiO2 in a thickness of 94 mn with MgF2 in a thickness of 100 nm. Exemplary materials used for anti-reflection coating 150b include: ZnS in a thickness of 58 nm with Al2O3 in a thickness of 85 nm; (2) ZnS in a thickness of 58 nm with Al2O3 in a thickness of 100 nm; and, (3) SiO2 in a thickness of 2 nm with ZnS in a thickness of 58 nm with Al2O3 in a thickness of 96 nm. Exemplary materials used for anti-reflection coating 150c include: Al2O3 in a thickness of 180 nm with ZnS in a thickness of 100 nm with MgF2 in a thickness of 10 nm; (2) Al2O3 in a thickness of 170 nm with ZnS in a thickness of 100 nm with MgF2 in a thickness of 10 nm; and, (3) Al2O3 in a thickness of 154 nm with ZnS in a thickness of 109. Exemplary materials used for anti-reflection coating 150d include: (1) MgF2 in a thickness of 190 nm; (2) MgF2 in a thickness of 200 nm; and, (3) MgF2 in a thickness of 204 nm with Al2O3 in a thickness of 209 nm. The anti-reflection coating 150 is designed to provide very low reflection at each interface over a wide range of incident angles of incoming light, due to the angle dispersion of this incoming light from the concentrating optics, and over the wavelength range of the sun's spectrum incident on that interface. In some embodiments, the one or more encapsulant materials are comprised of silicone, or ethylene-vinyl (EVA), or any other suitable material.

In some embodiments, the multijunction PV 105 cell is positioned on a substrate 160. In one embodiment, substrate 160 comprises high infrared transparency glass. In said embodiment, the high infrared transparency glass substrate 160 demonstrates high thermal conductivity and mechanical stability. In some embodiments, the high transparency glass may transmit light in a wavelength range from about 400 nm to about 5 microns. In other embodiments, the high transparency glass may transmit light with at least a range from about 800 nm to about 2.5 microns. As shown in FIG. 1B, substrate 160 may be formed of any suitable infrared-transparent substrate. For example, in some embodiments, the substrate 160 may comprise infrared-grade fused silica. In other embodiments, the substrate 160 may comprise $CaF_2$, $MgF_2$, ZnSe, or any other suitable material. In one embodiment, the substrate 160 may be coated with anti-reflection coating 150 on either or both sides of the substrate 160. In some embodiments, the substrate 160 may be positioned within or on top of a structural support frame 190. In one embodiment, the frame 190 is metal. In other embodiments, the frame 190 may be comprised of any suitable material.

In some embodiments, the multijunction PV cell 105 is secured to the substrate with an adhesive 170 (and, optical adhesive 170 can also be considered an "encapsulant" as discussed above). In an embodiment, the adhesive 170 comprises a transparent liquid photopolymer optical adhesive. In another embodiment, the optical adhesive 170 comprises a mercapto-ester. In other embodiments, the adhesive 170 comprises chalcogenide materials or any other suitable materials with high transparency for out-of-band light, strong and stable adhesion, and high thermal conductivity. In some embodiments, the multijunction PV cell 105 is secured to the substrate 160 via a direct wafer bond (not shown). In an exemplary embodiment, an intermediate optical anti-reflection coating 150 is applied to the multijunction PV cell 105 to work in tandem with the adhesive 170.

Figure 1B:
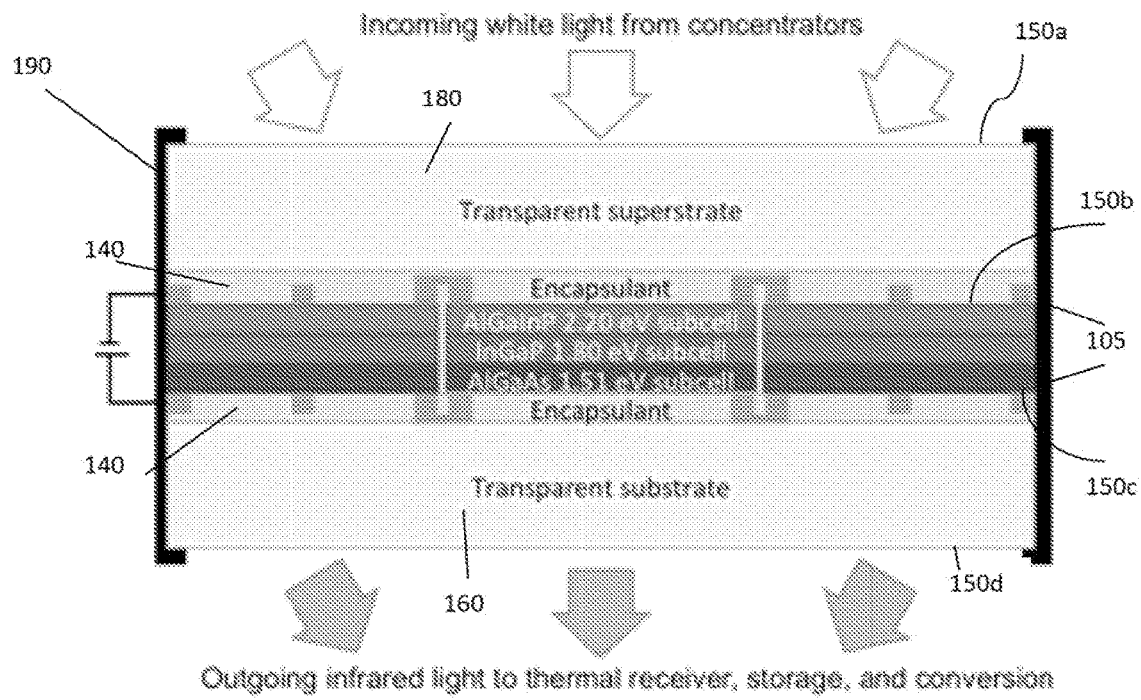
FIG. 1B shows a second embodiment of a CPV module.

In an alternative embodiment, shown in FIG. 1B, the transmissive CPV module 101 also includes an infrared-transparent superstrate 180. In another alternative embodiment, shown in FIG. 1C, the transparent substrate 160 and the transparent superstrate 180 are both composed of sapphire. Said embodiment further includes heat sink fins 190 (shown in cross-section; see FIG. 21 for an exemplary plan view) configured to be in contact with the outer circumference of the transmissive CPV module 103. The embodiment of FIG. 1C further comprises layers of optical adhesive 170. We speculate that a sapphire superstrate 180 and/or substrate 160 with a thickness in the range of 1 mm to 10 mm is best suited to conduct heat away from PV cell 105 to a heat sink, such as fins 190. In an embodiment, the fins 190 are comprised of aluminum. In another embodiment, the fins 190 can be made of any suitable heat-conducting material.

In some embodiments, the CPV module may incorporate passive cooling, with PV cells (such as PV cells 350) spaced a sufficient distance apart such that the substrate (such as substrate 357) dissipates the heat generated in said PV cells 350 without an active or power-consuming cooling method. In other embodiments, the cooling mechanism may be passively integrated into the CPV module at the focal point of a CPV system (such as CPV module 310) by using highly thermally conductive superstrate and substrate materials (such as sapphire) to laterally extract heat to heat sinks attached on either side of the CPV module 310 (such as fins 190 shown in FIG. 1C and heat sink 2150 shown in FIG. 21). In some embodiments, an integrated active cooling system (not shown) may involve microfluidic heat transport channels that transport a cooling fluid directly behind metal busbars (such as busbars 240) to avoid light absorption in the cooling fluid, or if the cooling fluid is a low light absorption material, the cooling may be integrated into the module between the multijunction PV cell 105 and the substrate 160. In other embodiments, the cooling system may be directly adjacent to the PV cell 105 on either side, where air, water, or another cooling fluid flows across or next to all or part of the surface of the CPV module (such as module 310) at a rate sufficient to remove heat generated in the CPV module.

In an embodiment, the contacts (such as contacts 390) on the substrate side for each subcell (such as subcells 371, 372 and 373) are recessed in each cell and are planar with the substrate (such as substrate 357). In another embodiment, the contacts (such as contacts 390) are not planar with the substrate (such as substrate 357). In some embodiments, wire bonding (as described below in connection with FIG. 3) is used to connect the subcells to an electrical grid printed on the substrate. In another embodiment, indium bump bonding (not shown) is used to connect subcells to the cell interconnection grid, or both indium bump bonding and wire bonding may be used in parallel, one for the top contacts and another for the bottom contacts. However, any suitable inter-connection method may be used to connect cells (such as cells 350) together.

Figure 2:
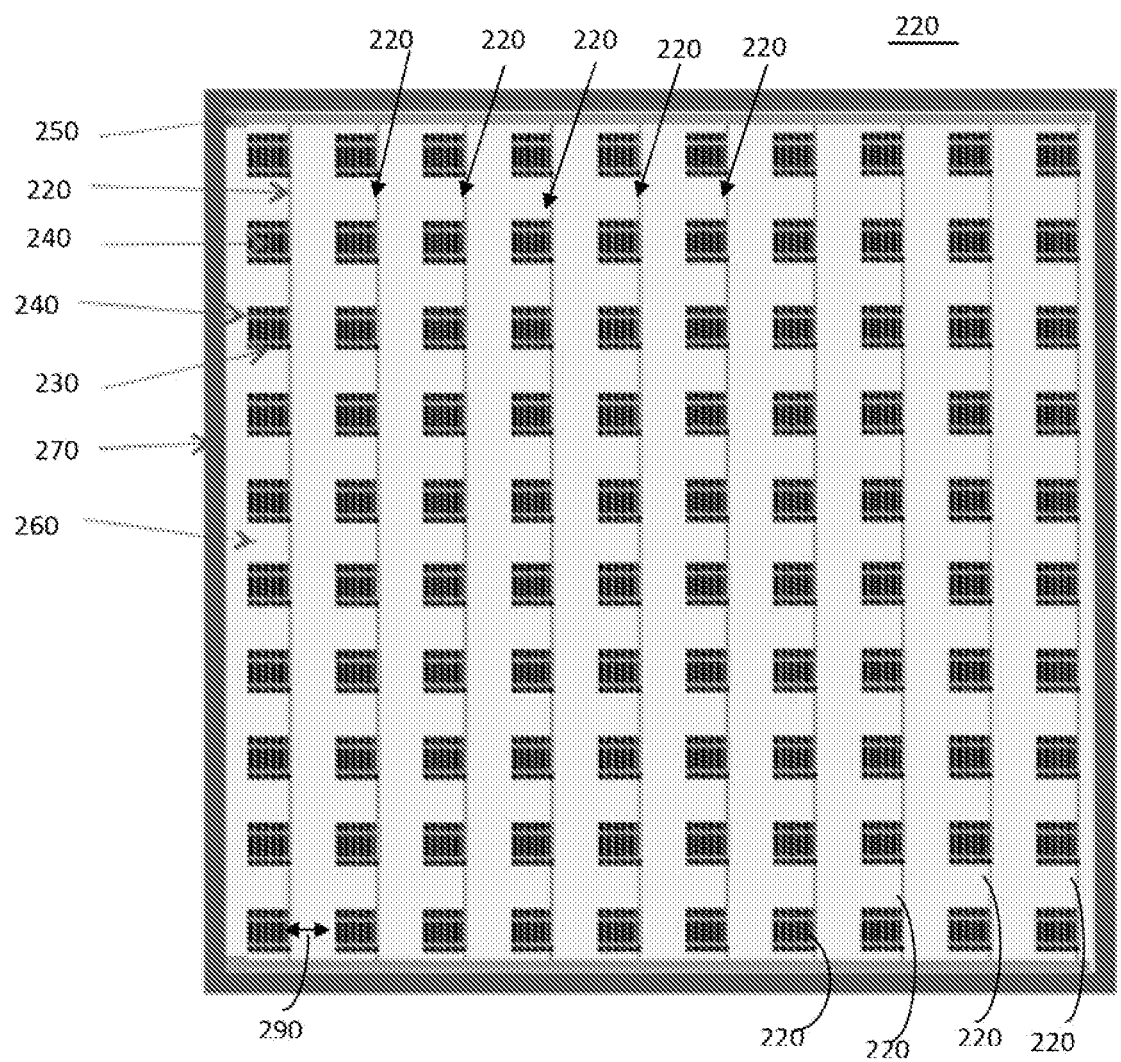
FIG. 2 shows one embodiment of a CPV module comprising a number of smaller multijunction PV cells mounted on glass substrate all supported on a metal frame.

In FIG. 2 an embodiment of a transmissive CPV module 200 is shown comprising a number of smaller multijunction PV cells 210 mounted on glass substrate 260 (but any suitable infra-red transparent substrate will do), all supported on metal frame 270. In the embodiment of FIG. 2, each smaller multijunction PV cell 210 is interconnected via interconnection leads 220 such that moving along one side of the device CPV module 200, the voltage produced from each smaller multijunction PV cell 210 is added together while the currents match (i.e., are similar in value), and that moving along the adjacent side of the CPV module 200, the voltages produced from each smaller multijunction PV cell 210 match (i.e., are similar in value) while the currents are added together. In one embodiment, electrons generated in the semiconductor material within a given PV cell 210 travel to a number of collection fingers 230 to be captured by the electrical circuit. The collection fingers 230 may be comprised of narrow strips of metal that are patterned onto the surface of PV cell 210. The collection fingers 230 conduct current to busbars 240, which may consist of wider metal wires that then conduct the current to the interconnection leads 220 between cells 210, where said busbars 240 are then connected to an interconnection lead 220. Each respective interconnect 220 is connected to contact pad 250, which is itself connect to an electrical system where the power generated by module 200 is either stored or used.

In one embodiment, the smaller multijunction PV cells 210 are triple junction cells. In some embodiments, smaller multijunction PV cells 210 are arranged such that the gap 290 between each cell is sufficient to transmit the full solar spectrum, including in-band (i.e., light within the absorption band of the multijunction PV cells) and out-of-band light (i.e., light outside of the absorption band of the multijunction PV cells), through the substrate 260 of the device. This enables more light to be directed to a thermal receiver and storage system (not shown) mounted behind module 200 and enables easier dissipation of heat generated in the cells 210. In other embodiments, the multijunction PV cells 210 are arranged such that the gap 290 between each cell 210 is minimized so that minimal to no visible light can pass through the module 220 without first passing through one of the cells 210. We speculate that an optical bypass (OB) (i.e., the percentage of the surface area of a given CPV module 220 that is not occupied by a multijunction PV cell 210) in the range of 30% to 50% is preferred.

Figure 3:
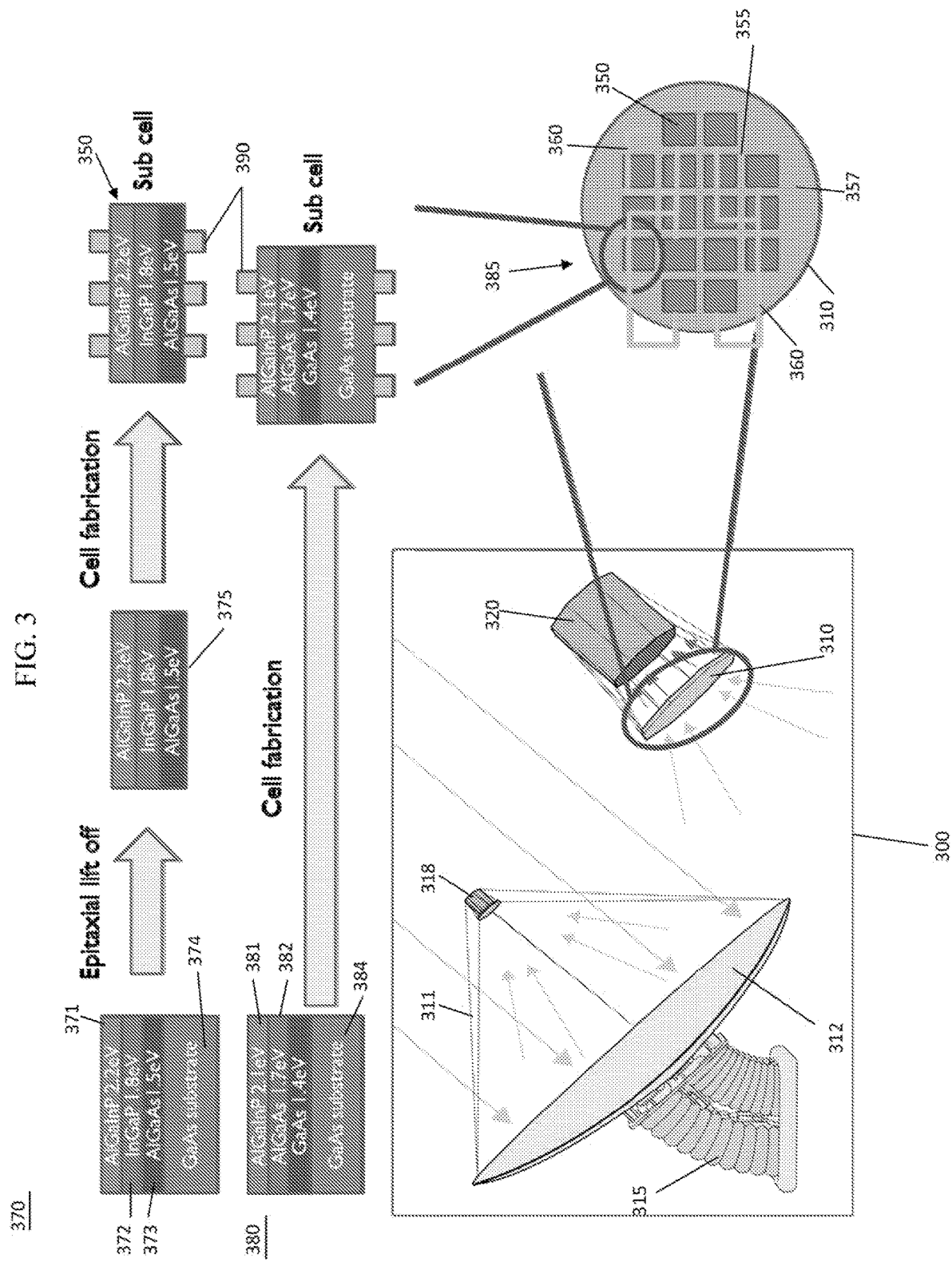
FIG. 3 shows an exemplary CPV module, where said exemplary module includes an array of sixteen (16) multijunction PV cells mounted on an infra-red transparent substrate, said cells being interconnected via interconnection lead; and further shows the fabrication of said subcells.

In some embodiments, such as that shown in FIG. 3, the CPV module 310 may be placed at the focal point of a sunlight concentration system 300 to maximize the amount of concentrated sunlight entering the CPV module 310. In some embodiments, the sunlight intensity achieved in such a concentration system can reach from one-hundred to one-thousand times normal, unmagnified sunlight. In one embodiment, sunlight concentration system 300 comprises a reflector 312, an actuator 315 (also commonly referred to as a solar tracker), support struts 311, and a focal point module 318, where said focal point module 318 further comprises CPV module 310 and thermal receiver 320. As shown in FIG. 3, reflector 312 can be a concentric (or otherwise concave) reflector dish; additionally, in an alternative embodiment, reflector 312 can be replaced by a Fresnel lens concentrator (not shown). In an exemplary embodiment, the focal point module 318 is placed at the focal point of reflector 312 to maximize the uniformity of concentrated sunlight across the surface of CPV module 310. This may be accomplished by constructing CPV module 310 so that the area featuring PV cells 350 is smaller than the focal spot of the concentrated beam created by reflector 312, thus allowing light around the edges of the concentrated beam to bypass the multijunction PV cells 350 and to shine directly into the thermal receiver 320. In an alternative embodiment, the CPV module 310 may be placed in the path of a concentrated sunlight beam but not at the focal point of concentric reflector 312, such that a portion of the light bypasses the multijunction PV cells 350 around the edges of same. This placement enables the focal point of concentric reflector 312 to be at the aperture of the thermal receiver 320 and maximizes the uniformity of light on the CPV module, while also minimizing the aperture size of the thermal receiver 320. Maintaining uniformity of illumination on the CPV module 310 enables said module 310 to achieve maximum power output for a given total incident light intensity. Utilizing a placement as described herein demonstrates an advantage of the present invention relative to conventional CPV. In the present invention, it is acceptable for light to not be incident on the multijunction PV cells 350 as long as such light is directed into the thermal receiver 320. In conventional CPV systems, all concentrated sunlight must be directed onto the cells in the CPV module.

Figure 4:
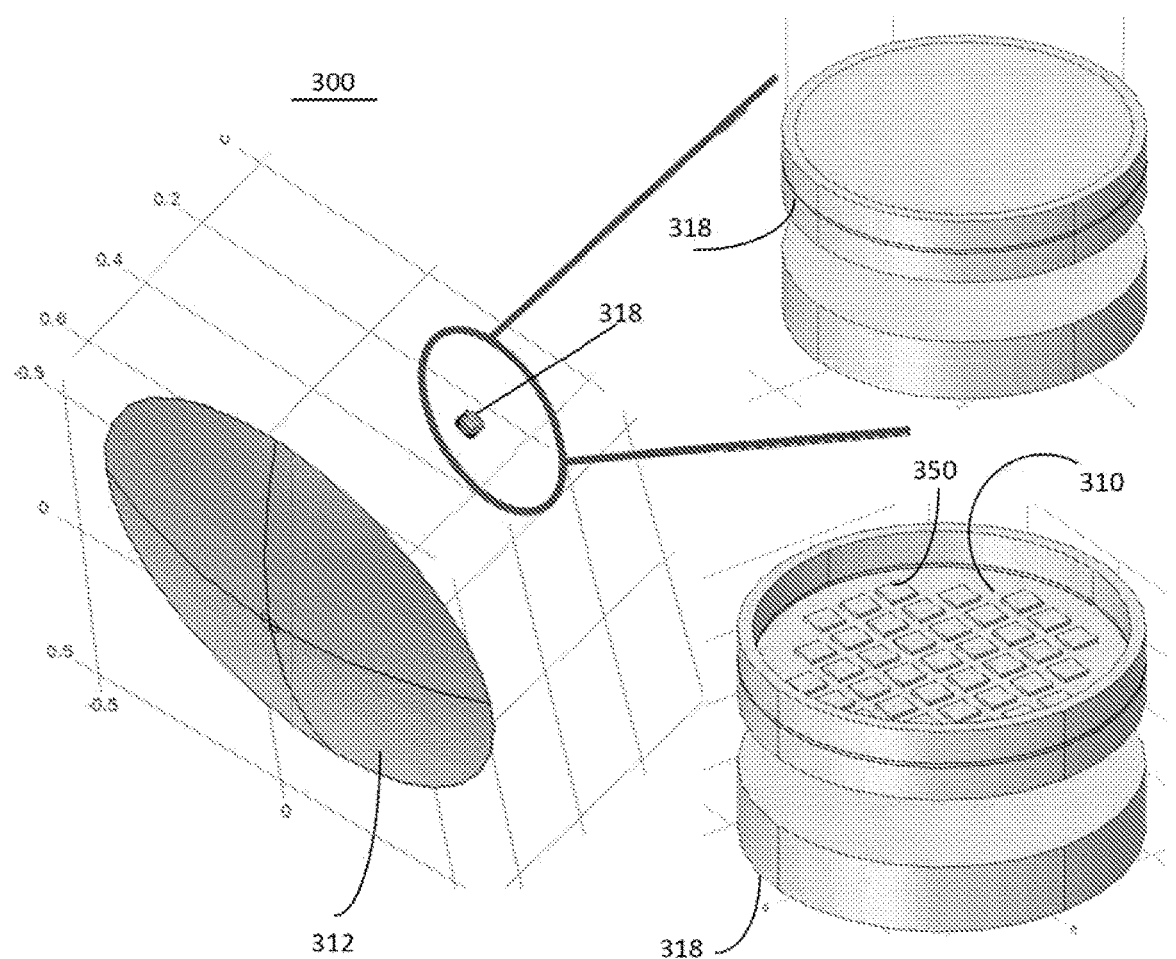
FIG. 4 shows a view of a sunlight concentration system, including a perspective view of a reflector, a closer view of a module, and a view of a module without the transparent superstrate which covers a CPV module.

FIG. 3 also depicts an exemplary transmissive CPV module 310, where said exemplary module 310 includes an array of sixteen (16) multijunction PV cells 350 mounted on an infrared transparent substrate 357, said cells 350 being interconnected via interconnection leads 360. As is discussed below, the CPV module 310 may be configured in many different ways by varying both the number of multijunction PV cells 350, the size of the respective multijunction PV cells 350, and the gaps 355 between the respective multijunction PV cells 350. FIG. 4 shows another view of system 300, including a perspective view of reflector 312, a closer (i.e., "exploded" or "zoomed in") view of module 318, and a second view of module 318 without the transparent superstrate which covers CPV module 310 (and, thus, showing an exemplary configuration of multijunction PV cells 350). Note that any infrared transparent superstrate may be used.

Figure 5:
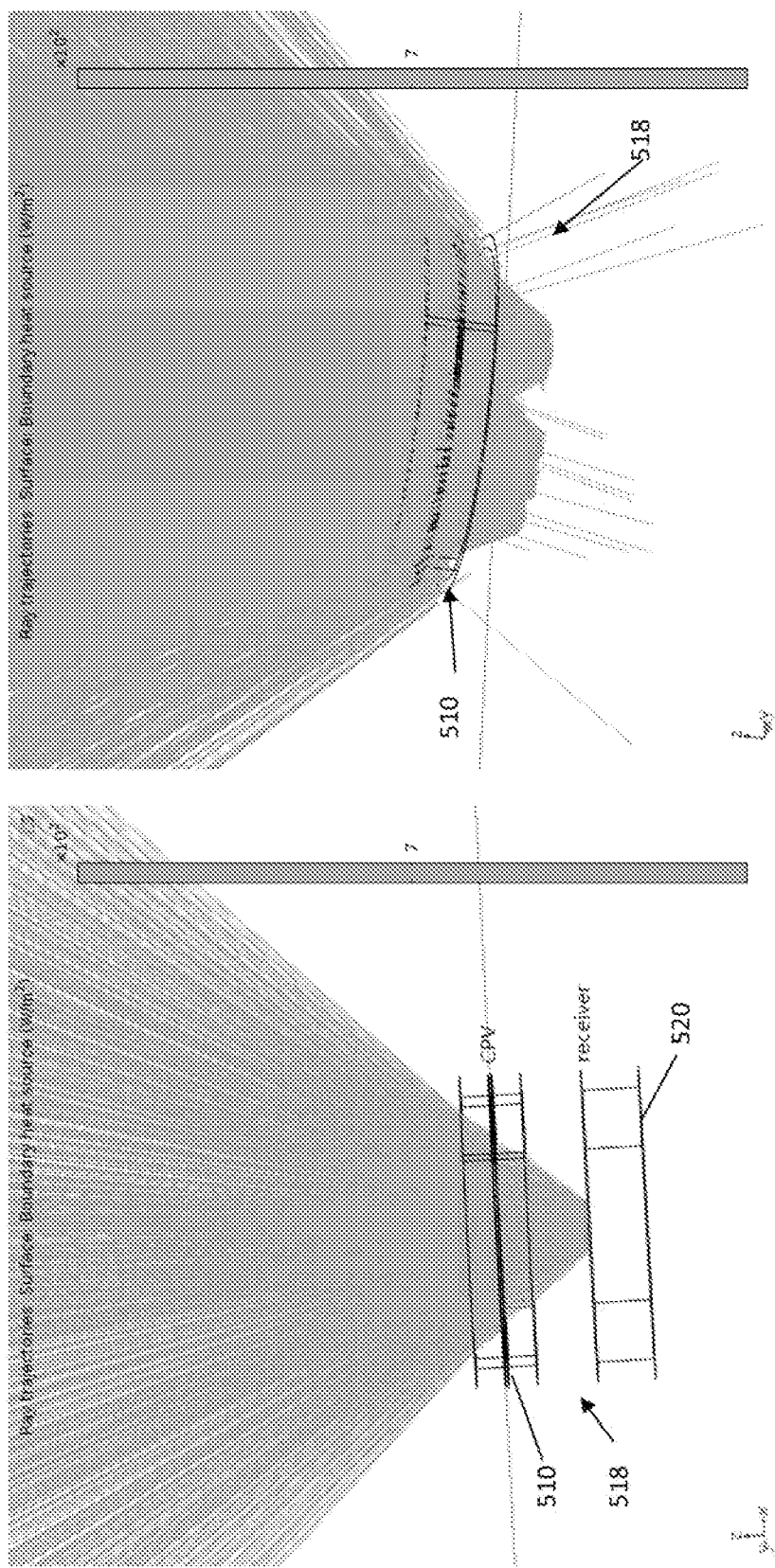
FIG. 5A shows positioning of an exemplary focal point module, comprising a CPV module and a thermal receiver relative to the focal point of an ideal reflector.
FIG. 5B shows positioning of a focal point module relative to the focal point of an exemplary non-ideal reflector.

In some embodiments, the reflector 312 is not perfectly smooth or uniform (and, thus is not ideal). FIG. 5A shows positioning of an exemplary focal point module 518, comprising a CPV module 510 and a thermal receiver 520 relative to the focal point of an ideal reflector (not shown). FIG. 5B shows the positioning of the same focal point module 518 relative to the focal point of an exemplary non-ideal reflector (not shown). In both FIGS. 5A and 5B, the lines passing through, and focusing on (or near), the focal point module 518 are simulated ray trajectories of light reflected by the exemplary ideal and non-ideal reflectors, respectively.

In an exemplary embodiment, the present invention provides a method of converting some solar energy to electricity while transmitting other solar energy to an energy conversion and/or storage system. Referring to system 300 of FIG. 3, the present invention carries out the aforementioned mentioned method by directing solar energy to a CPV module 310 including at least one PV cells 350 which comprises at least two subcells (such as subcells 371 and 372), each with a distinct bandgap. The subcells 371 and 372 absorb high energy light and convert such high energy light to electricity. Low energy light is transmitted through the CPV module 310 to an energy conversion and/or storage system (such as thermal receiver 320). In some embodiments, the high energy light comprises light with wavelengths of about 280 nm to about 1800 nm (although most systems operate in the 280 nm to 900 nm range). In some embodiments, the low energy light comprises light with wavelengths of about 700 nm to about 3000 nm. In some embodiments, the CPV module 310 includes at least two photovoltaic subcells (such as subcells 371 and 372), each with a distinct bandgap, and in a preferred embodiment, the device comprises three photovoltaic subcell junctions (such as PV cell 350) with respective bandgaps of about 2.2 eV, about 1.8 eV and about 1.51 eV. A graphs showing the various bands of solar energy, and the methods of capture by an embodiment of the present invention, is shown in FIG. 16 (showing bands A, B and C, corresponding to the three junctions of a PV cell 350 as shown, for example, in FIG. 3, and showing a fourth band D of energy which passes through the PV cell 350 and continues on to a thermal receiver, such as thermal receiver 320). In a preferred embodiment, the device operates at temperatures of about 110 degrees Celsius or below.

Experimental

Fabrication

One embodiment of the transmissive CPV module (such as CPV module 310) may be fabricated as follows. Multiple junction III-V photovoltaic heterostructures are grown from precursors such as solid or metal-organic column III and column V materials epitaxially on GaAs or Ge substrates using metal-organic chemical vapor deposition (MOCVD), molecular beam epitaxy (MBE), or related epitaxial growth techniques. These epitaxially grown materials are then processed into PV cells (such as cells 350). First, top metallic contacts (such as contacts 390) are patterned on the surface of the epitaxial growth and the contact layer material in the III-V epitaxy is preferentially removed where there is no contact metallization performed on the epitaxial wafers; in some embodiments, this may require a thermal annealing step to achieve low contact resistance. Next, the cells (such as cells 350) are protected by a photoresist or related material, and the spaces between said cells are etched through to the GaAs substrate underneath. Then, the triple junction cell epitaxial material is removed from the GaAs or Ge substrate via epitaxial liftoff, using a black wax handle or other removable handle. Epitaxial liftoff is accomplished by etching through a release layer (e.g., AlAs) using a highly selective etchant such as hydrofluoric acid. The black wax handle is then removed (a GaAs, glass, or similar handle may also be used).

The opposing side of the photovoltaic cells 350 are then patterned with a metallic grid (such as contacts 390), again removing the contact epitaxial layer where it is not needed and annealing as necessary. Ideally, the front and back metallic grids on either side of the cells (such as busbars 240) are co-aligned to minimize shadowing of light passing through said cells. An intermediate optical anti-reflection coating (such as coating 150) is applied to this side, which is designed to work in tandem with an optical adhesive or encapsulant (see FIG. 1A or 1B). The encapsulant (such as encapsulant 14) is used to attach the lifted off triple junction cells (such as PV cell 105) to a highly-infrared transparent substrate (such as substrate 160). The cells should be aligned with an electrical interconnect circuit (such as interconnects 220) on the substrate (such as substrate 160). An indium bump bond, wire bond, or other method or methods can be used to electrically connect the cell to the interconnect circuit from both the top and bottom contacts. A top anti-reflection coating is applied to the exposed surface of the CPV module (i.e., the surface not on the substrate). An anti-reflection coating may also be applied to the backside of the glass substrate. Each of these coatings may be applied in one or more layers of optical coating materials using materials such as $TiO_2$, $MgF_2$, $SiO_2$, or any other suitable materials. For example, see discussion above regarding placement of anti-reflection coatings 150.

FIG. 3 shows two approaches to subcell fabrication in line with the fabrication process described above. In the first process 370, three junctions 371, 372 and 373 are grown on a GaAs substrate 374 with bandgaps of approximately 2.2 eV, 1.8 eV, and 1.5 eV (plus or minus 0.1 eV), respectively. These layers are grown on an epitaxial liftoff layer, allowing the triple junction CPV subcell 375 (comprised of junctions 371, 372 and 373) to be removed from the GaAs substrate 374 via epitaxial liftoff and subsequently fabricated into a cell 350. This epitaxial lift-off process reduces optical losses for the infrared out-of-band light passing through the new cell, and reduces cost by allowing the GaAs wafer to be reused. In the second approach 380, three junctions 381, 382, and 383, are grown on a GaAs substrate 384, with bandgaps of approximately 2.1 eV, 1.7 eV, and 1.4 eV (plus or minus 0.1 eV), respectively. These junctions are not grown with an epitaxial liftoff layer, and subcells are formed that include the triple junction epitaxy and the wafer into the fabricated subcell. We speculate that this is an easier, lower risk fabrication process than is commonly used, and that said process still allows almost as much out-of-band infrared light to pass through the cell as in the first approach 370. As noted above, metallic contacts 390 are patterned onto the top and bottom surfaces of the cell material during their formation.

Figure 1C:
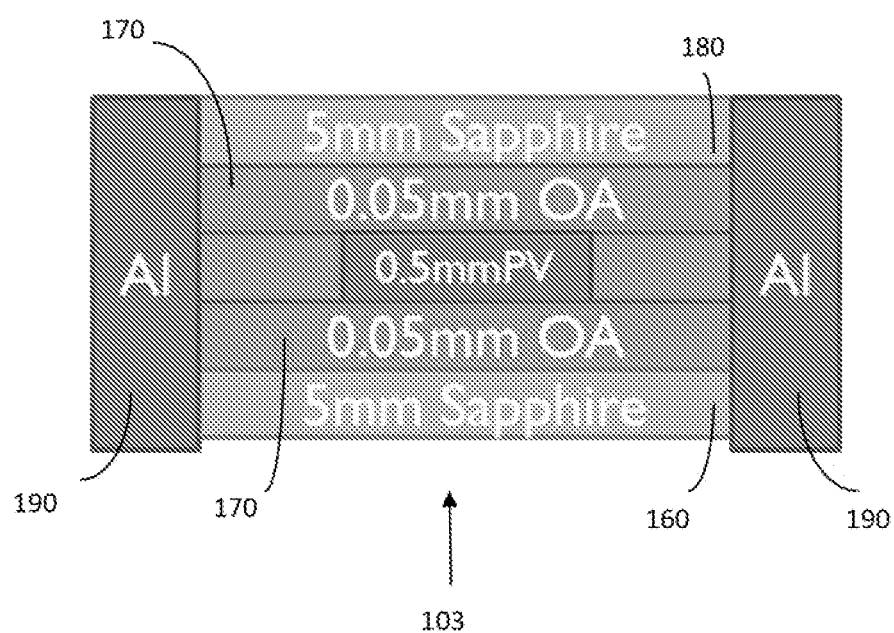
FIG. 1C shows a third embodiment of a CPV module, wherein the said module comprises a transparent superstrate and transparent substrate, both comprised of sapphire.

An array, such as array 385, is formed from a set of isolated cells 350, with appropriate contacts between elements formed via metallic interconnects 360 patterned onto the substrate. Bypass diodes (not shown) are integrated as necessary behind (or near) the photovoltaic cells 350 in order to minimize losses related to partial shadowing of the module 310. Finally, the wiring is completed. An encapsulating layer (such as encapsulant 140) is deposited via spinning or another means onto the array of cells 350 mounted on the substrate 357. An infrared transparent superstrate (such as superstrate 180) is then attached to the top of array 385. An anti-reflection coating 150 may also be applied to the backside of the substrate (see as surface 162) and/or to the topside of the superstrate (see surface 182). The array 385 is then framed as necessary for integration into a larger energy conversion system (for example, see module 318, including CPV module 310, as shown FIG. 4). A heat sink may be integrated into the frame to extract heat form the superstrate (such as superstrate 18) and substrate 357 and reject said heat into the environment (see, e.g., heat sink 2150 shown in FIG. 21, or heat sink fins 190 in FIG. 1C). A profile of a completed CPV module comprising a single PV cell 350 is shown in FIGS. 1A, 1B and 1C. A top down view of exemplary CPV module arrays are shown in FIGS. 2, 3 and 4. The spaces 355 between cells can be very narrow to maximize the fraction of photons converted directly to electricity by the PV cells 350. Alternatively, the spacing 355 between cells 350 can be much larger (e.g., spacing between cells 350 on the order of 1/10th to 10× the size of the cells 350) in order to enable more sunlight to pass through the module 310 to a thermal storage device (such as thermal receiver 320). This alternative configuration, with more spacing between cells 350, provides several benefits, such as the ability to more easily keep the cells 350 from overheating. As discussed below, arrays such as array 385 may come in many configurations.

FIG. 6 shows three CPV modules 610, 620 and 630, each comprising 37 multijunction PV array elements 650, where the degree of shading is indicative of the relative temperature of each array element. Module 610 is comprised of multijunction array elements 25 mm² in size, with gaps 615 between respective array elements of 0.5 mm. Module 620 is comprised of multijunction array elements 25 mm² in size, with gaps 625 between respective array elements of 1 mm. Module 630 is comprised of multijunction array elements 25 mm² in size, with gaps 635 between respective array elements of 1.5 mm. As can be seen in FIG. 6, the maximum temperature measured is inversely proportional to the size of the gaps between array elements. And, the associated amount of energy which bypasses the PV module is directly proportional. FIG. 7 shows the same CPV modules shown in FIG. 6, but with light intensity plots replacing temperature plots.

FIG. 8 shows two variations of a CPV module, modules 810 and 820, each having 37 multijunction array elements 850 and 21 multijunction array elements 850, respectively. FIG. 8 shows the relative intensity of light striking each element 850 of modules 810 and 820. The size of array elements 850 in both modules 810 and 820 is 25 mm², and the gap 825 between the array elements of modules 810 and 820 is 0.5 mm. In view of the results of the light intensity plots shown in FIG. 8, it is speculated that the amount of light striking the outer-most elements of 810 is much lower than the intensity striking the inner array elements, and thus we speculate that the outer-most elements are not worth the added cost and heating to the system (and the elimination of said outer-most elements thus results in a module identical to module 820). Thus, said outer-most elements 850 may be removed without a significant loss in energy capture by the 21 element module 810 as compared to the 37 element module 820; and, thus, we speculate this will allow for a material decrease in production costs with only an incremental decrease in power generation. FIG. 9 shows the same CPV modules as FIG. 8, but the light intensity plots have been replaced by temperature plots showing the relative temperature of each array element. As can be seem, the elimination of the outer-cells reduces the maximum temperature experienced by the CPV module by five (5) degrees centigrade.

Figure 10:
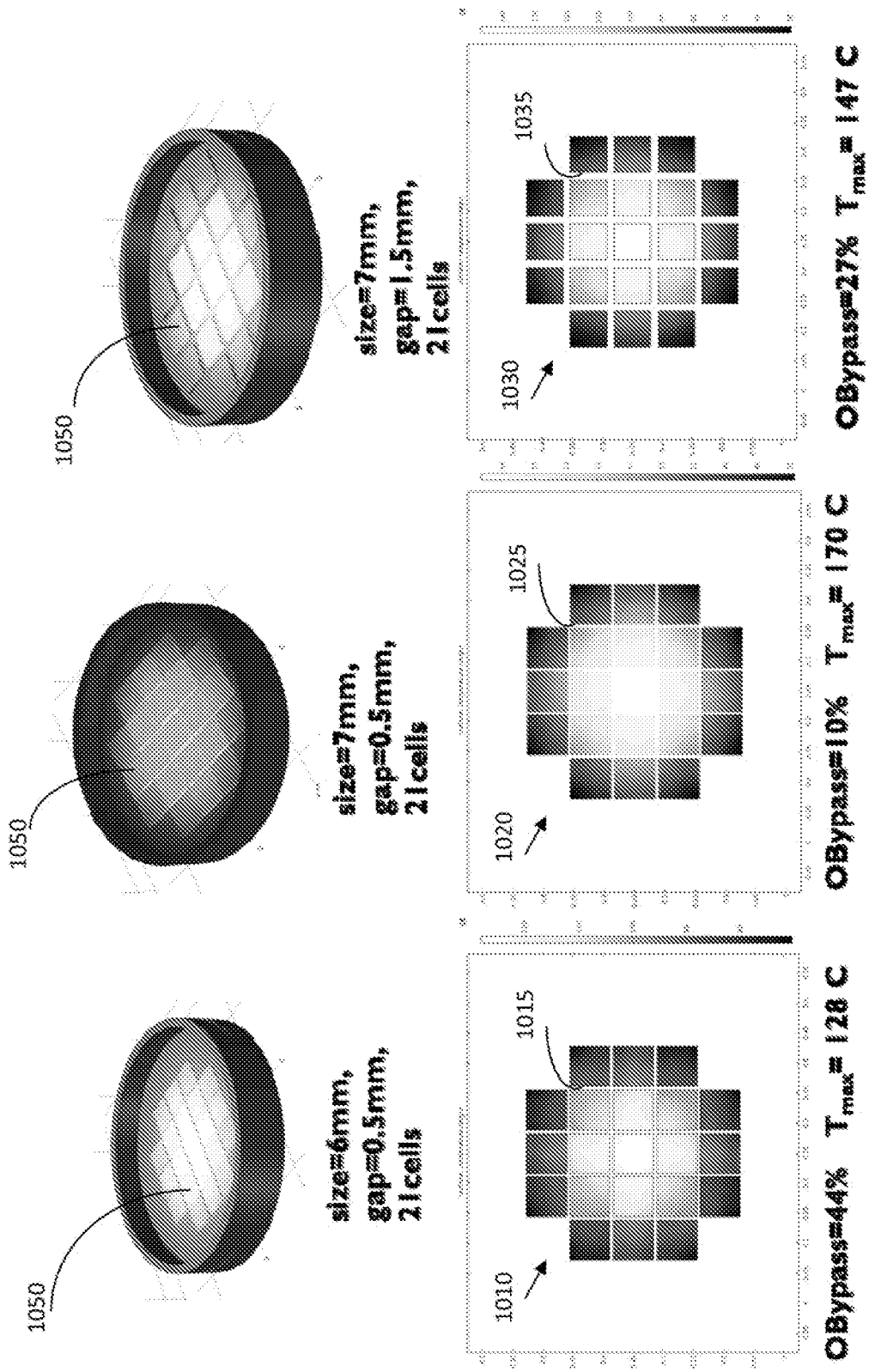
FIG. 10 shows three CPV modules, each having multijunction array elements, where the degree of shading is indicative of the relative temperate of each array element.

FIG. 10 shows three CPV modules, 1010, 1020 and 1030, each having 21 multijunction array elements 1050, where the degree of shading is indicative of the relative temperature of each array element. Module 1010 is comprised of multijunction array elements 36 mm² in size, with gaps 1015 between respective array elements of 0.5 mm. Module 1020 is comprised of multijunction array elements 49 mm² in size, with gaps 1025 between respective array elements of 0.5 mm. Module 1030 is comprised of multijunction array elements 49 mm² in size, with gaps 1035 between respective array elements of 1.5 mm. As can be seen in FIG. 10, the maximum temperature measured is affected by both changes in element size as well as changes in the size of the gap between elements.

Figure 11:
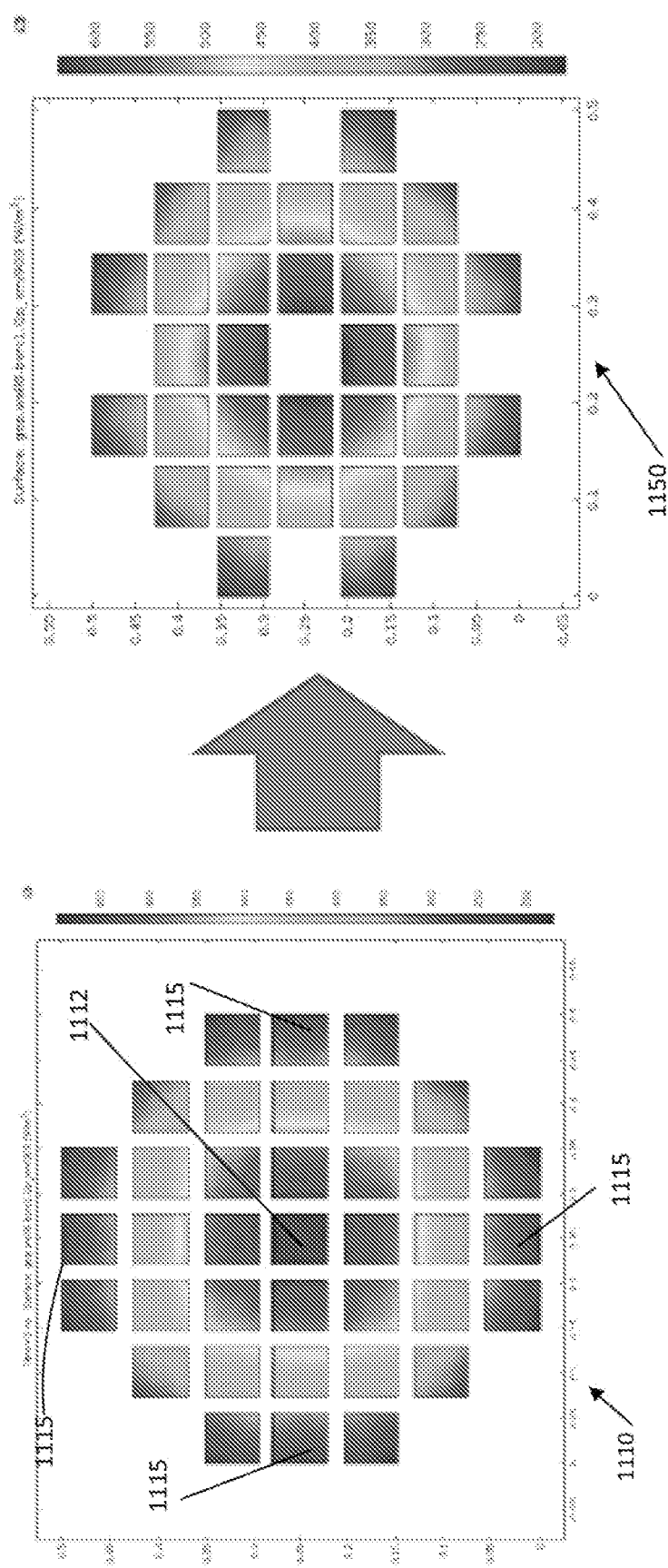
FIG. 11 shows changes in temperature recorded on individual multijunction array elements, and the changes in said temperatures caused by the removal of select array elements from the CPV module.

FIG. 11 shows changes in temperature recorded on individual multijunction array elements, and the changes in said temperatures caused by the removal of select array elements from the CPV module. CPV module 1110 is a 37 element array. CPV module 1150 is a 32 element array. In our model, we found that removing the center array element 1112, along with the outer-most elements at the "center" of each side of said array (shown as elements 1115), resulted in a reduction of peak temperature from 140 degrees Celsius to 110 degrees Celsius. Additionally, we found that the intensity of light hitting the center array element 1112 caused the current generated by element 1112 to be higher than the current generated by other elements in the module, thus making it more difficult to match the current from element 1112 with the current from the other array elements. Further, the configuration of module 1150 is generally easier to wire together, as the 37 element array of module 1110 required array elements to be wired in such a manner as to make overcurrent conditions more likely along the associated interconnection leads. In an alternative embodiment (not shown), center element 1112 is kept, but is of a smaller size than (i.e., has a smaller surface area than) the other elements in the array (and, so, this smaller center element 1112 would generate current closer to the current generated by other elements in the array, despite the intensity of light striking said center element).

Figure 12:
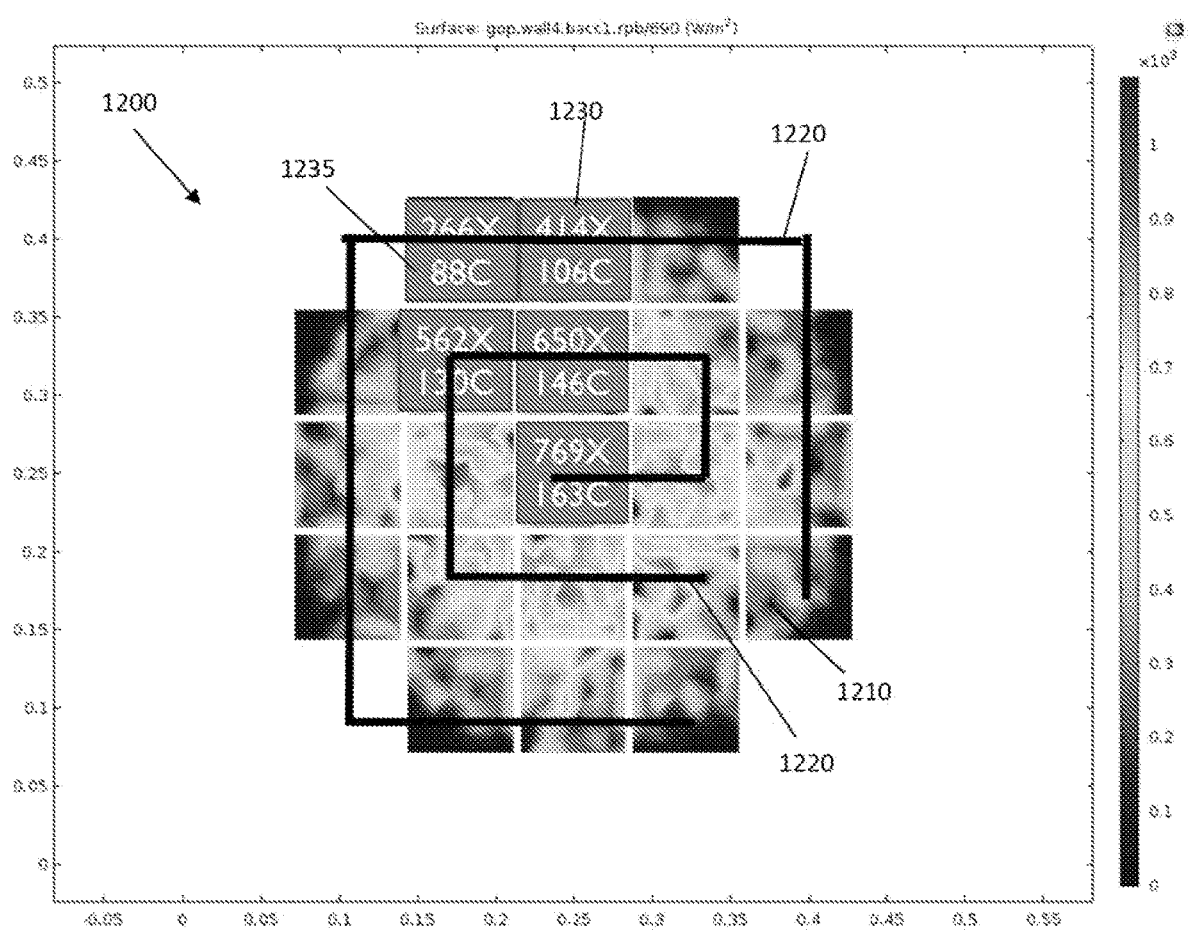
FIG. 12 shows a CPV module comprised of twenty-one (21) array elements, where said array elements are connected to a system bus (not shown) via interconnection leads.

FIG. 12 shows a CPV module 1200 comprised of twenty-one (21) array elements 1210, where said array elements 1210 are connected to a system bus (not shown) via interconnection leads 1220. Also shown are exemplary values 1230 and 1235, where the values 1230 (at the top of the notated array elements) represents the intensity of light measured on said array element as a multiple of ordinary direct sunlight, and the value 1235 (at the bottom of the notated array elements) represents the temperature measured on said array element in degrees Celsius. The shading differences on the plot shown in FIG. 12 depict variations in light intensity.

Figure 13:
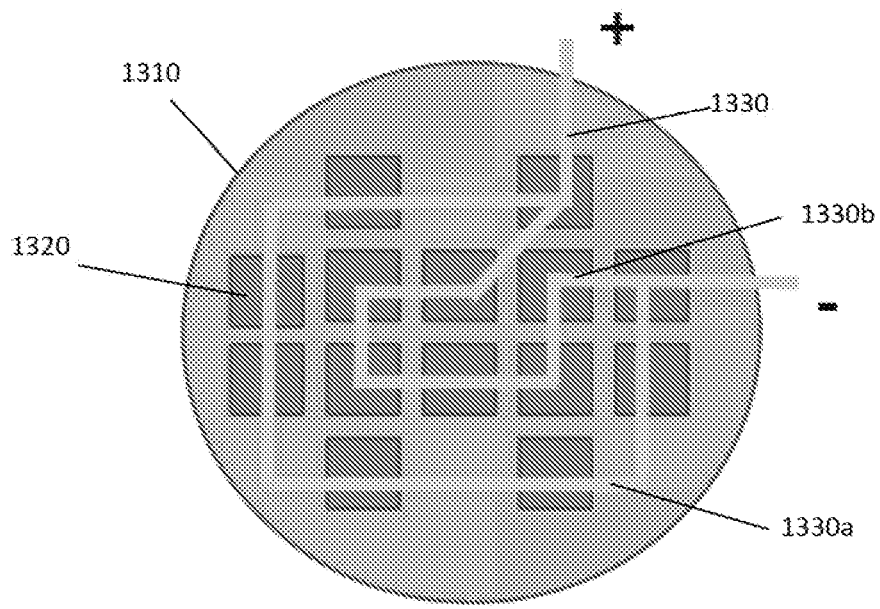
FIG. 13 shows a CPV module with an alternative arrangement of array elements, where said array elements are connected to a system bus (not shown) via interconnection (where interconnection is not representative of the exactly manner of physically connecting the array elements, but rather is representative of how said elements are connected in series).

FIG. 13 shows a CPV module 1310 with an alternative arrangement of array elements 1320, where said array elements are connected to a system bus (not shown) via interconnection 1330 (where interconnection is not representative of the exactly manner of physically connecting the array elements, but rather is representative of how said elements are connected in series). More specifically, interconnect 1330 comprises series loop 1330*a* and series loop 1330*b*, where loop 1330*a* and 1330*b* are connected in parallel with one another. This arrangement is designed to connect those array elements 1320 in series that share a similar current (due to their receipt of similar light intensity based on their position on module 1310).

Figure 14:
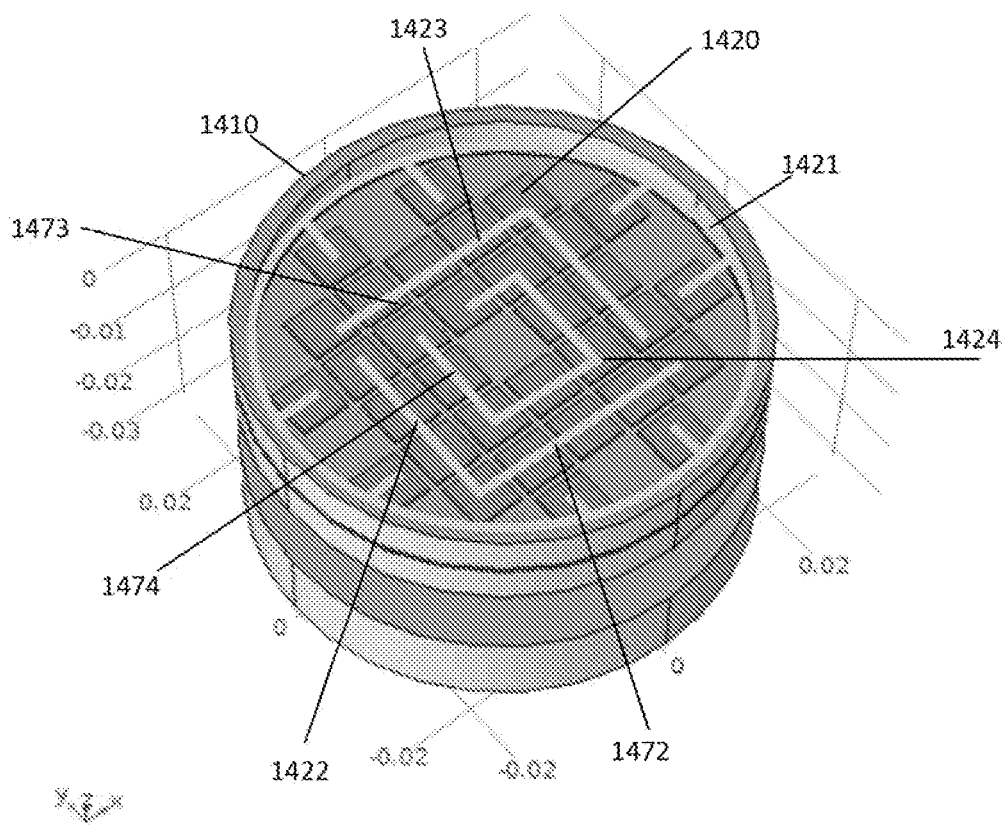
FIG. 14 shows a CPV module with an alternative arrangement of array elements, where said elements are separated into four groups, each of which comprises a group of eight (8) elements connected in series (as shown via the connecting lines where each element touched by a given line is connected in series with the other elements touched by the same line), and where groups are connected to one another in parallel.

FIG. 14 shows a CPV module 1410 with another alternative arrangement of array elements 1420, where said elements are separated into four groups, 1421, 1422, 1423 and 1424, each of which comprises a group of eight (8) elements 1420 connected in series (as shown via the connecting lines 1471, 1472, 1473 and 1474, where each element 1420 touched by a given line is connected in series with the other elements 1420 touched by the same line), and where groups 1421, 1422, 1423, and 1424 are connected to one another in parallel.

Figure 15:
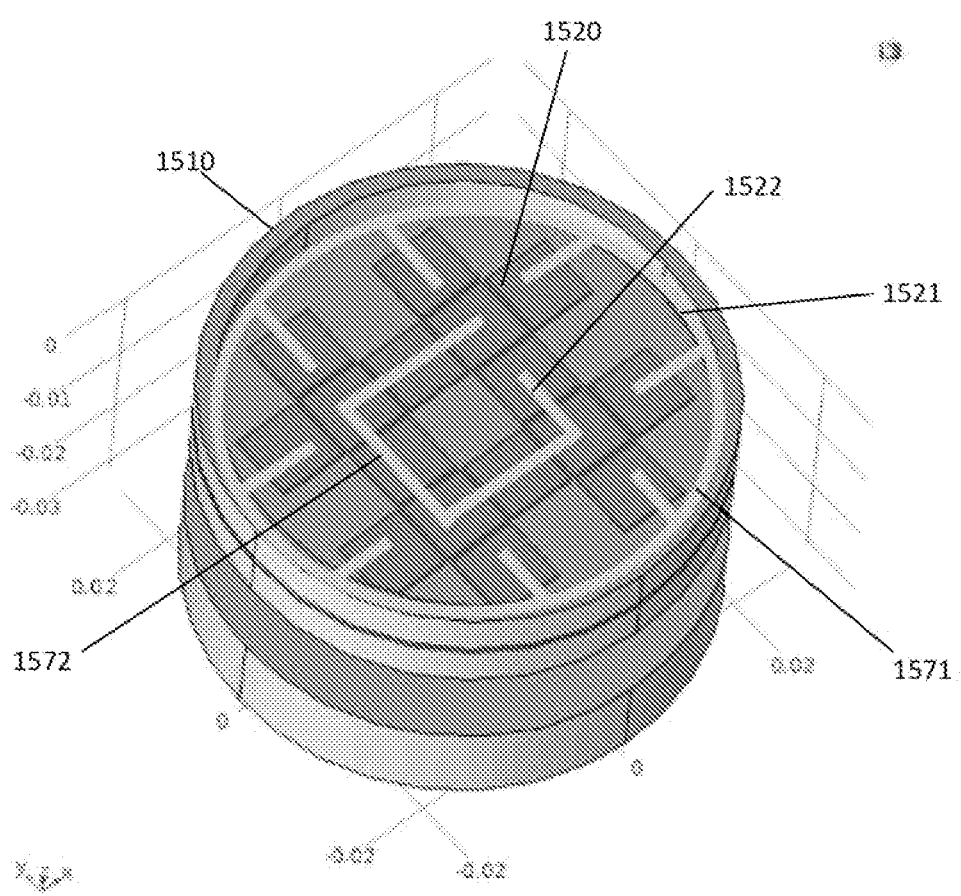
FIG. 15 shows a CPV module with another alternative arrangement of array elements, where said elements are separated into two groups, each of which comprises a group of eight (8) elements connected in series (as shown via the connecting lines, where each element touched by a given line is connected in series with the other elements touched by the same line), and where groups are connected to one another in parallel.

FIG. 15 shows a CPV module 1510 with another alternative arrangement of array elements 1520, where said elements 1520 are separated into two groups, 1521 and 1522, each of which comprises a group of eight (8) elements 1520 connected in series (as shown via the connecting lines 1571 and 1572, where each element 1520 touched by a given line is connected in series with the other elements 1520 touched by the same line), and where groups 1521 and 1522 are connected to one another in parallel.

Current Matching and Focal Point Drift

Figure 17:
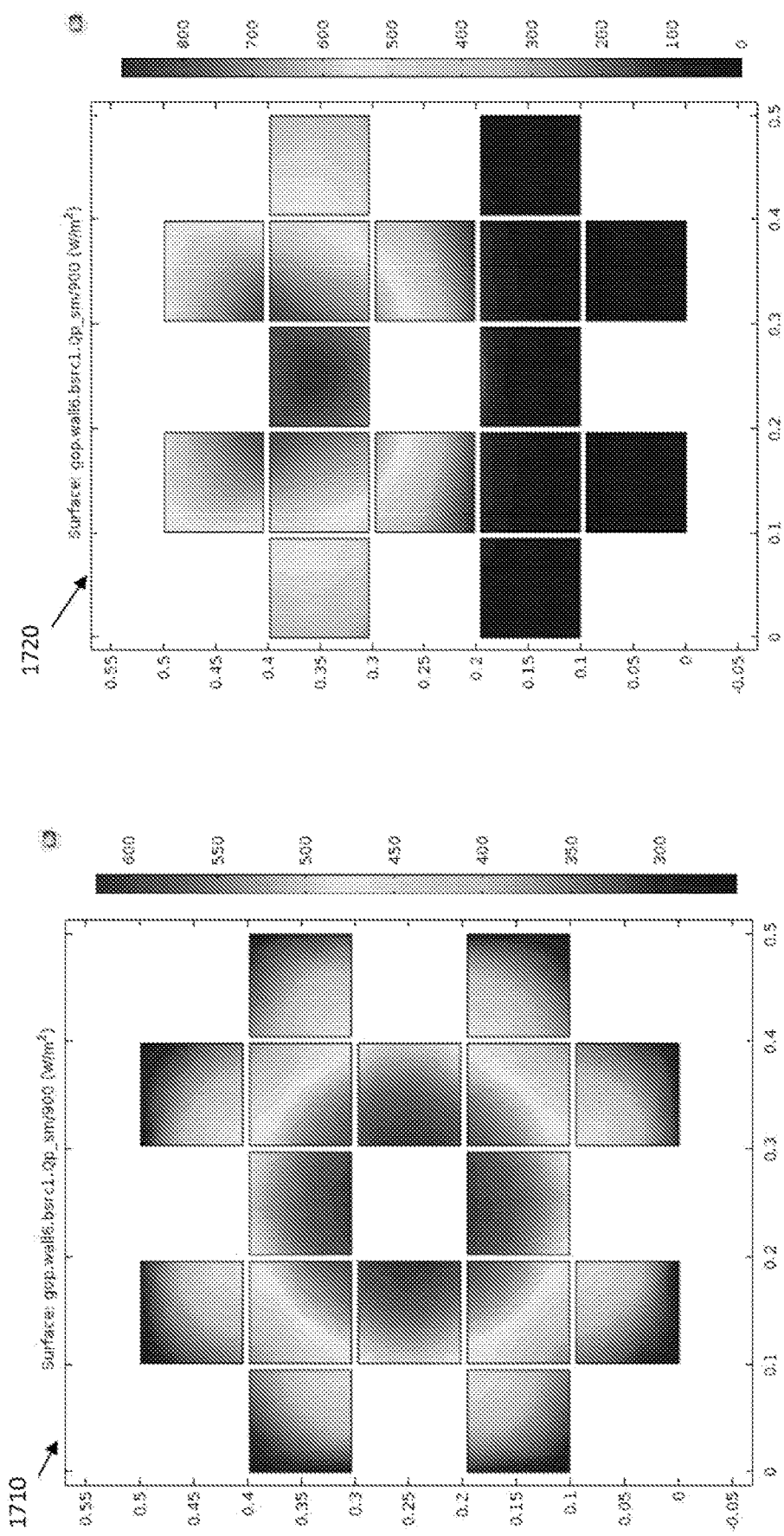
FIG. 17 shows the difference in light intensity between an array of elements where there is no focal point drift and an array of elements where there is one degree of focal point drift.

One of the major challenges in designing compact CPV modules of the type described herein is to maintain current matching between array elements connected in series. Current matching is especially important in situations where the focal point of a reflector that is part of a sunlight concentration system (such as system 300) drifts, thereby causing some PV cell array elements in a series of connected array elements to receive less light than other array elements in that same series of connected array elements. For example, FIG. 17 shows the difference in light intensity between an array of elements 1710 where there is no focal point drift and an array of elements 1720 where there is one degree of focal point drift. As these plots make clear, if the wiring scheme shown in FIG. 15 were used in a situation where one degree of focal point drift takes place, the individual array elements in group 1522 could have significantly different current outputs.

Figure 18:
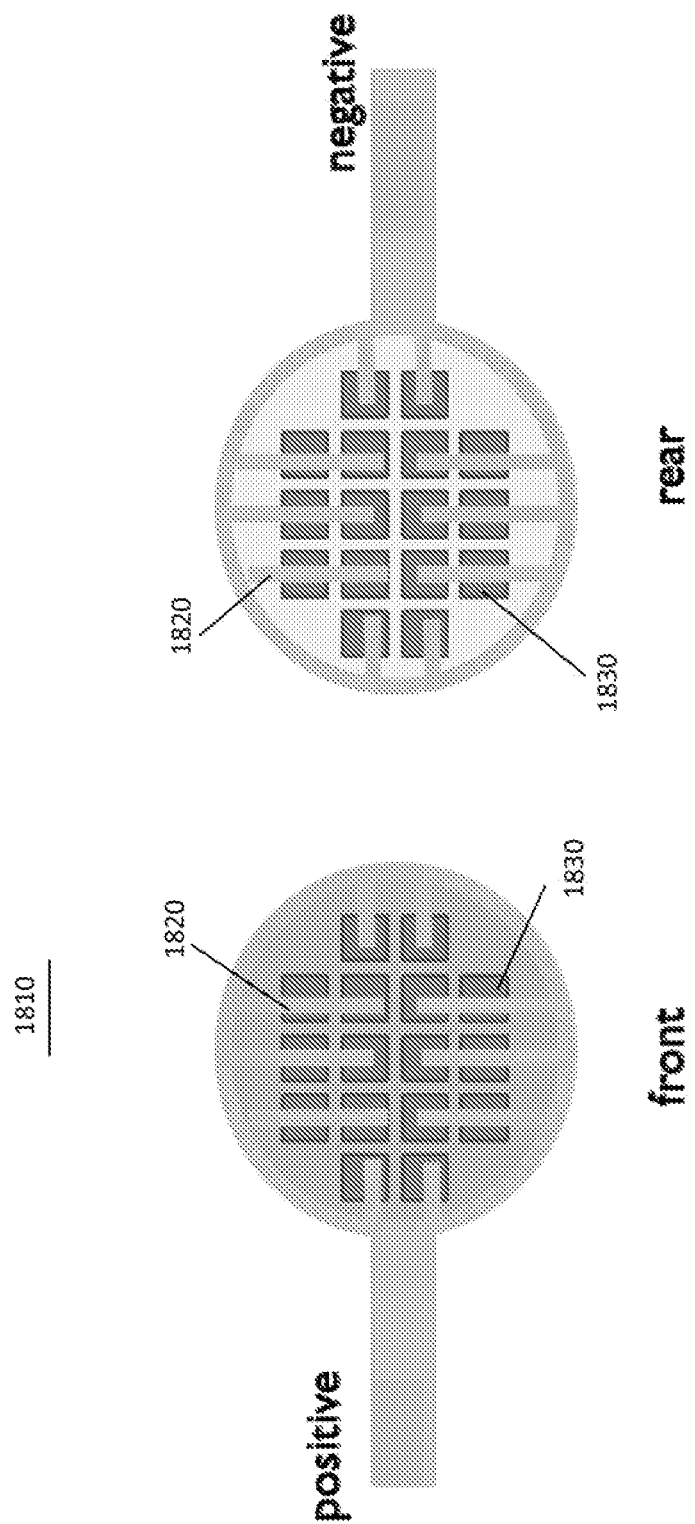
FIG. 18 shows a CPV module which is "bifacial," which means that the interconnection leads are found on both the front and back of the PV module (preferably in an alignment so as to minimize shading by the interconnection leads).

An embodiment designed to mitigate the problems caused by focal point drift is shown in FIG. 18. In this embodiment, the CPV module 1810 is "bifacial," which means that the interconnection leads 1820 are found on both the front and back of the PV module (preferably in an alignment so as to minimize shading by the interconnection leads). Note that all of the CPV module embodiments described herein are designed in this "bifacial" manner. By connecting all of the array elements 1830 electrically in parallel with one another, all currents in each cell add and issues related to current matching are minimized. We speculate the voltage mismatch will not be a problem, as voltages are expected to be nearly the same on all cells, due to higher temperatures (which decreases voltage) and higher illuminations (which increases voltage) occurring concurrently in the same cells as the focal spot wanders.

Figure 19:
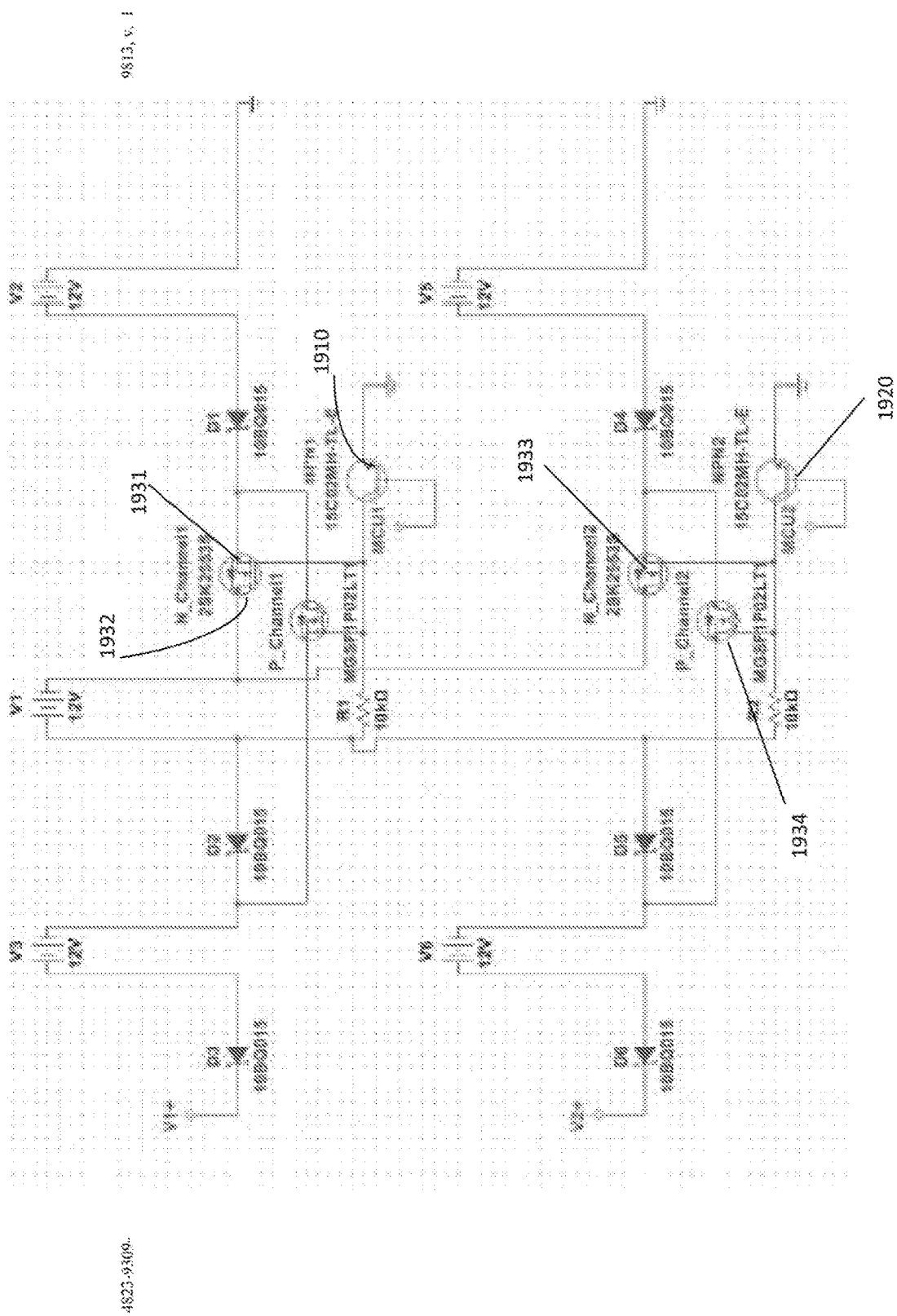
FIG. 19 shows a PSPICE model of an exemplary active control circuit.

In an alternative embodiment designed to mitigate the problems caused by focal point drift, active circuit control is employed to "regroup" array elements contained within a given PV module in order to group cells with similar current outputs into strings with similar voltage and, thus, minimize current and voltage mismatch issues as the focal spot wanders. Specifically, the individual array elements cells are actively rewired into new "groups" by an array of MOSFET's (see MOSFET's 1931, 1932, 1933 and 1934) activated by an embedded microcontroller running a custom sorting and measuring program. A PSPICE model of an exemplary active control circuit is shown in FIG. 19. Circuit 1900, shown in FIG. 19, comprises a microcontroller with two connections (MCU1) and (MCU2) designed to control switching transistors 1910 and 1920. It should be recognized that circuit model 1900 may be replaced by any control circuit capable of reconfiguring (i.e., regrouping array elements connected in series) array elements based on the current outputs of each individual array element in a PV module.

The following algorithm is an example of code used to run a microcontroller as described in the preceding paragraph (where the following code is modified from native microcontroller code to run in Java). In the context of the circuit diagram of FIG. 19, the microcontroller code below has a list of coordinates for each array element. When the algorithm is fed the coordinates of the focal point of the reflector (i.e., the "sun spot") (which may be determined via various methods), the algorithm sorts and ranks each array element by its proximity to the sun spot. The algorithm can also directly track photocurrent generated in each cell to determine the appropriate sorting and ranking of cells. The algorithm then organizes the array elements into 4 groups or strings (this number is flexible). Circuit 1900 comprises two groups (i.e., circuit paths). The MOSFET transistors allow array elements to be bypassed by some paths and connected in series to others. When the algorithm sorts the array elements into their paths, the microcontroller will set the transistors appropriately so that each array element is bypassed by all but its assigned path. Paths are denoted by V1+ and V2+, while the connections to the microcontroller are labeled MCU1 and MCU2. The exemplary code is as follows:

```
import processing.core.*;
import processing.data.*;
import processing.event.*;
import processing.opengl.*;
import java.util.HashMap;
import java.util.ArrayList;
import java.io.File;
import java.io.BufferedReader;
import java.io.PrintWriter;
import java.io.InputStream;
import java.io.OutputStream;
import java.io.IOException;
public class ActiveRewireSim_v2_1 extends PApplet {
PFont f;
int cellCt = 24;//totla number of cells
int cellW = 6;//number of columns
int cellH = 4;//number of rows
int cellR = 40;//cell radius(only for simulation)
int [ ]xCell = new int[cellCt];//x values of cells
int [ ]yCell = new int[cellCt];//y values
float [ ]dCell = new float[cellCt];//distance to sun spot
float[ ][ ] distMat = new float[2][cellCt];
//combined distance and number assignment
public void setup( ){
    size(100*(cellW+1),100*(cellH+1));
    background(0);
    f = createFont("Serif",32,true);
    for(int i = 1; i < (cellW+1); i++){//create cells/coordinates
        for(int j = 1; j < (cellH+1); j++){
            int cellPos = ((j-1)*cellW)+i-1;
            xCell[cellPos] = 100*i;
            yCell[cellPos] = 100*j;
        }
    }
}
public void draw( ){
    background(0);
    textFont(f,20);
    fill(255);
    textAlign(CENTER, CENTER);
    text("Color indicates current group. Red = HIGH, Black =
    LOW",width/2,20);
    text("Mouse indicates center of illumination.",width/2,50);
    text("Numbers are proximity ranking.",width/2,height-40);
    for(int i = 0; i < cellCt; i++){//calculate distance to sun spot
        float xDiffS = sq(abs(xCell[i] - mouseX));
        float yDiffS = sq(abs(yCell[i] - mouseY));
        dCell[i] = sqrt(xDiffS + yDiffS);
    }
    for(int i = 0; i<cellCt; i++){//create record of distance
        distMat[0][i] = dCell[i];
        distMat[1][i] = i;
    }
    float[ ][ ] distSort = sortRowTop(distMat, cellCt);//sort by distance
    for(int i = 0; i<cellCt; i++){//determine coloring/wiring
        if(i < cellCt/4){
            stroke(255);
            fill(255,0,0);
            cellR = 47;
        }
        elseif(i < cellCt/2){
            stroke(255);
            fill(255,150,0);
            cellR = 37;
        }
        elseif(i < 3*cellCt/4){
            stroke(255);
            fill(200,200,0);
            cellR = 32;
        }
        else{
            stroke(255);
            fill(25,10,0);
            cellR = 27;
        }
        //Draws cells and colrs/sizes by proximity to sun spot
        int intTop = PApplet.parseInt(distSort[1][i]);
```

-continued

```
        ellipse(xCell[intTop],yCell[intTop],cellR,cellR);
        fill(255);
        text(i+1,xCell[intTop],yCell[intTop]);
    }
    stroke(255,128,0);
    fill(255,200,0);
    ellipse(mouseX,mouseY,25,25);//Draw sun spot
```

Figure 20:
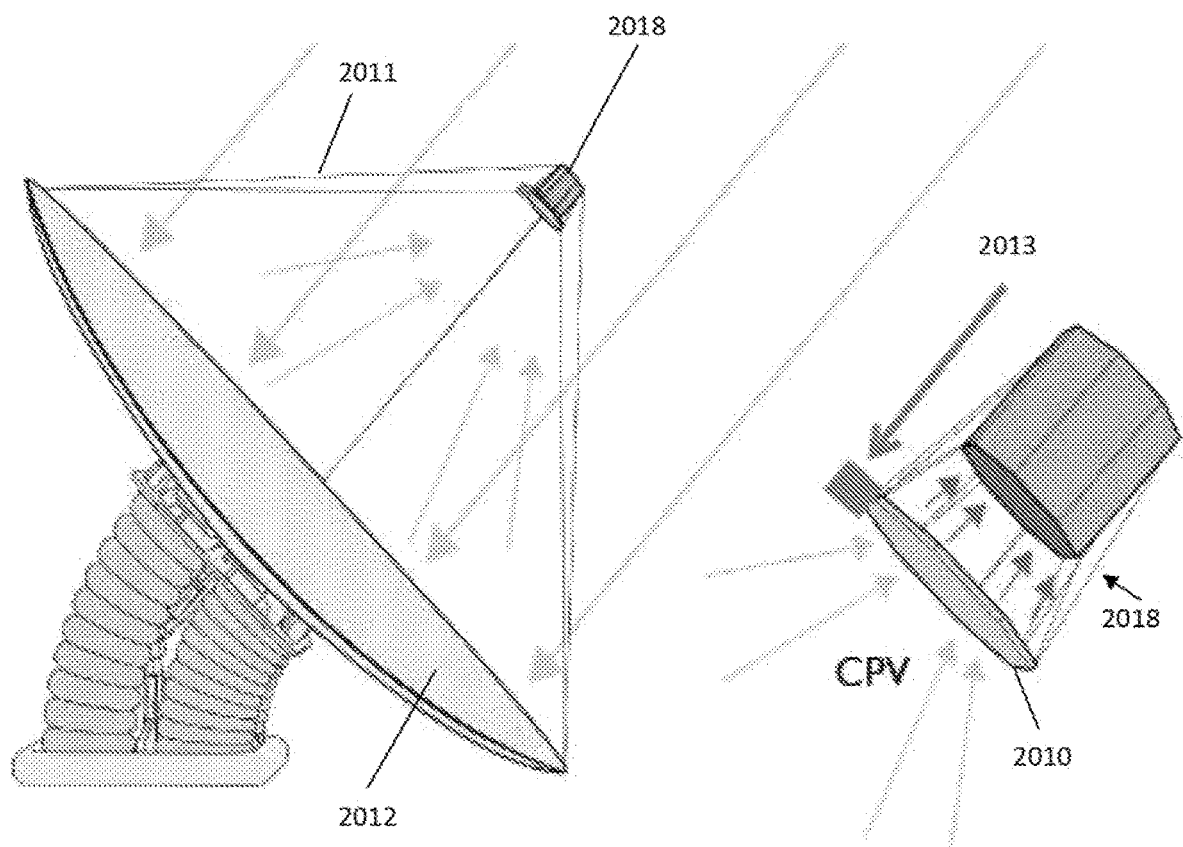
FIG. 20 shows an embodiment of a system comprising a reflector, a focal point module, and support struts, and a stepper motor (with controller), where said focal point module is periodically realigned with the focal point of reflector by stepper motor.

In another alternative embodiment designed to mitigate the problems caused by focal point drift, a small, two-axis stepper motor could be placed between the transmissive CPV and the support struts such that said motor could automatically realign the CPV module to keep the focal point of the reflector centered on the CPV. FIG. 20 shows such an embodiment, where system 2000 comprises a reflector 2012, a focal point module 2018 (which further comprises CPV module 2010), support struts 2011, and a stepper motor (with controller) 2013, where said focal point module is periodically realigned with the focal point of reflector 2012 by stepper motor 2013.

Figure 21:
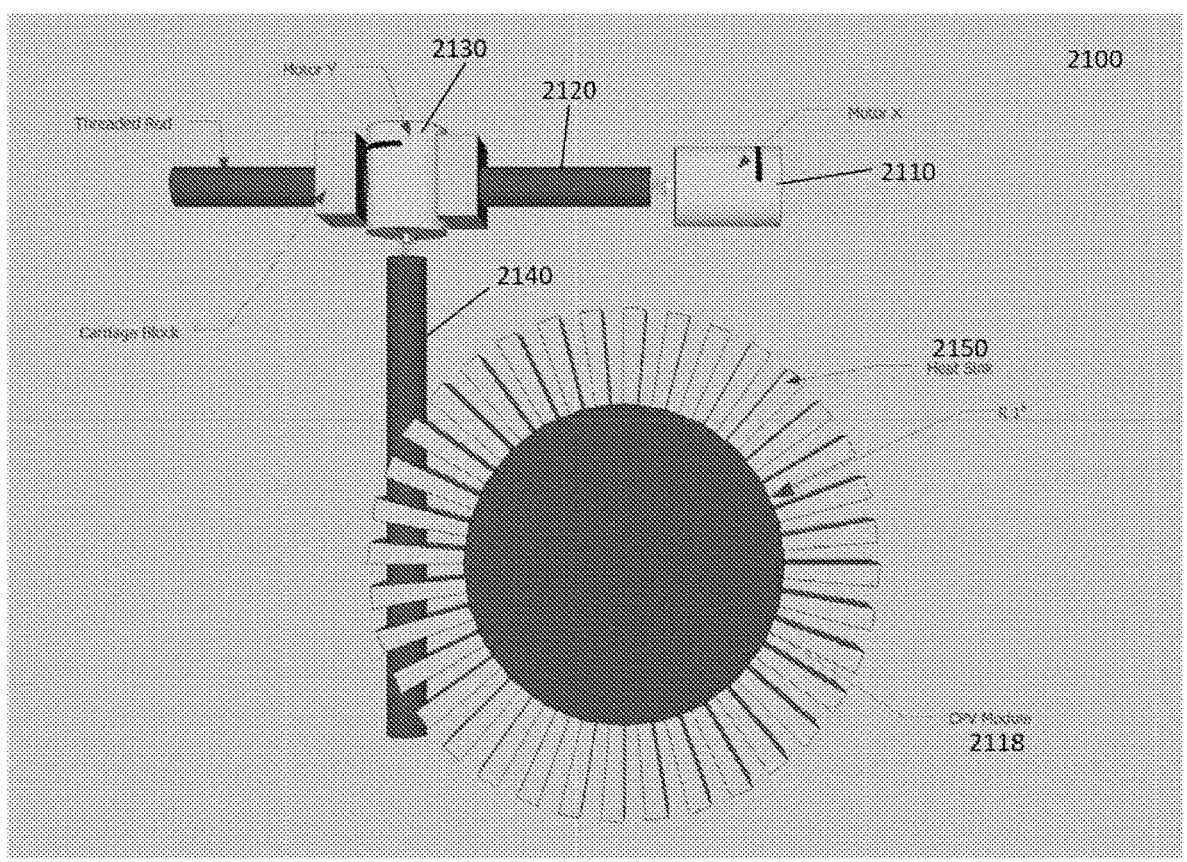
FIG. 21 shows an exemplary stepper motor assembly which comprises x-axis motor, threaded rod, y-axis motor, mounting rod, and CPV module.

FIG. 21 shows an exemplary stepper motor assembly 2100 (such as the motor assembly 2013 referenced above), which comprises x-axis motor 2110, threaded rod 2120, y-axis motor 2130, mounting rod 2140, and CPV module 2118. The embodiment of FIG. 21 further comprises heat sink 2150. In operation, a controller will actuate x-axis motor 2110 and y-axis motor 2120 in order to keep CPV module 2118 within the focal point of a reflector (such as reflector 2012). Specifically, threaded rod 2120 is threaded through and affixed to y-axis motor 2130 such that, when x-axis motor 2110 operates, y-axis motor 2130, mounting rod 2140 and CPV module 2118 all move linearly in the x-axis synchronously with x-axis motor 2110. Likewise, mounting rod 2140 is affixed to y-axis motor 2130 and CPV module 2118 such that, when y-axis 2130 operates, mounting rod 2140 rotates, thereby causing CPV module 2118 to move linearly in the y-axis. We speculate that motor assembly 2100, when controlled by a control system, will keep CPV module 2118 within the focal point of any associated solar concentrator optic (such as reflector 2012). In an embodiment, the control system could use the power out from the CPV module 2010 as the feedback mechanism to guide the real-time realignment of the CPV module 2010 according to focal spot drift, with a goal of maximizing power output from CPV module 2010.

Electrical and Optical Physics and Losses

When a thin multijunction PV cell mounted on high infrared transparent substrate is positioned in the path of concentrated light, the PV cell absorbs all of the high energy light above the bandgap of the lowest bandgap subcell (the in-band light) and transmits most of the remaining low energy light (the out-of-band light) (see, e.g., graph in FIG. 16 depicting bands absorbed by CPV cell layers). This design results in extremely high efficiency, with as much as about 60% of in-band light energy converted to electrical energy, and with a pass-through optical transmission of as much as about 82% of the out-of-band light to the thermal receiver or heat storage device.

A CPV module could utilize single junction cells, dual junction cells, or triple junction cells. Quadruple junction cells may also be possible. The CPV module may utilize more than four junctions, including both epitaxially grown multijunction cells and multijunction cells that stack non-epitaxial junctions together into a monolithically integrated device stack (for example, by wafer bonding). The determination of which type of cell to use involves a complex optimization that takes into consideration other system losses and the performance and needs of a thermal storage device and a system for deploying the stored thermal energy. The use of additional junctions in the cell minimizes thermalization in the CPV converter.

III-V cell materials are well established as the highest-performing solar cell material, due to high material quality, direct bandgaps across the solar spectrum, and high external radiative efficiency (ERE). About 2.20 eV is a high yet realistic target for a direct band-gap III-V material lattice-matched to GaAs. The nitride material system is another option to convert high energy photons efficiently, as nitrides can attain much higher energy direct bandgaps.

A 2.20 eV junction may be formed from AlGaInP lattice-matched to GaAs. To achieve proper current matching and utilize realistic GaAs lattice-matched materials, the other two junctions may be InGaP at 1.80 eV and AlGaAs at 1.51 eV. The energy cut-off at 1.51 eV between light converted by the PV cell and light transmitted to a thermal storage device is an important parameter for system optimization. The expected out-of-band transmission losses are shown in Table 1. FIG. 16 shows a graph of how the spectrum is split between wavelengths that are converted directly to electricity and wavelengths that are transmitted through the CPV device and into a thermal storage device. The split shown is a preferred split for a triple junction cell, but the split may be located differently within the spectrum for various embodiments of the present invention.

TABLE 1

Out-of-band transmission losses
Additional losses:

| | |
|---|---|
| Absorption in encapsulant | 2.0% |
| Reflection at surface of CPV cell | 2.5% |
| Reflection/absorption at front contact grid | 4.0% |
| Free carrier absorption in cell | 0.6% |
| Reflection/absorption at back contact grid | 2.0% |
| Reflection at CPV-glass interface | 3.0% |
| Optical adhesive between cell and glass (absorption/scattering) | 1.0% |
| Absorption in glass substrate | 1.5% |
| Relfection at glass-air interface | 3.0% |
| Total transmission of below 1.51 eV light | 82% |

Assuming 500× concentration of light directed to the CPV, with 2.5% of incoming light reflected from the front of the cell:
For the 2.20 eV subcell (assuming 90% absorption and 0.1% ERE): $P_{max}$=6.79 W/cm$^2$
For the 1.80 eV subcell (assuming 90% absorption and 10% ERE): $P_{max}$=5.29 W/cm$^2$
For the 1.51 eV subcell (assuming 90% absorption and 1% ERE): $P_{max}$=4.15 W/cm$^2$
Total power from current-matched subcells: 16.23*0.975=15.82 W/cm$^2$
Total power in the solar spectrum above 1.51 eV: Power$_{\geq 1.51\ eV}$=26.41 W/cm$^2$
Total in-band efficiency of triple junction cell for light above 1.51 eV:
CPV$_{eff}$=59.9%

These expected performance values are derived from detailed balance calculations derated using realistic external radiative efficiency (ERE) and percent absorption values for each bandgap. The targeted current density, voltage, and fill factor for each subcell are shown in Table 2a. Table 2b shows the same values for a dual junction cell using bandgaps that are less risky, demonstrating that a high in-band conversion efficiency of 57.1% is attainable.

TABLE 2a

High risk triple junction subcell

| Bandgap (ERE) | $P_{max}$ [W/cm$^2$] | $J_{sc}$ [A/cm$^2$] | $V_{oc}$ [V] | Fill Factor |
|---|---|---|---|---|
| 2.22 eV (0.1%) | 6.39 | 3.67 | 1.88 | 0.927 |
| 1.80 eV (10%) | 5.35 | 3.67 | 1.59 | 0.917 |
| 1.50 eV (1%) | 4.08 | 3.67 | 1.24 | 0.899 |
| Total power in-band = 26.62 W/cm$^2$ | | | Efficiency = 59.4% | |

TABLE 2b

Medium risk dual junction subcell

| Bandgap (ERE) | $P_{max}$ [W/cm$^2$] | $J_{sc}$ [A/cm$^2$] | $V_{oc}$ [V] | Fill Factor |
|---|---|---|---|---|
| 2.05 eV (0.1%) | 7.87 | 4.96 | 1.72 | 0.923 |
| 1.585 eV (4%) | 6.14 | 4.96 | 1.36 | 0.906 |
| Total power in-band = 24.52 W/cm$^2$ | | | Efficiency = 57.1% | |

Temperature and Cooling

At 500 suns, in-band (above 1.51 eV) incoming solar power density is 26.41 W/cm$^2$. If the PV cells are 59.9% efficient in-band, heat generated from in-band light is 10.59 W/cm$^2$. At 500 suns, out-of-band (below 1.51 eV) incoming solar power density is 18.59 W/cm$^2$. If approximately 15% of this light is absorbed in the CPV device, heat generated from out-of-band light is 2.79 W/cm$^2$. The total heat from inefficient conversion/transmission of light is 13.38 W/cm$^2$; for an 18 cm by 18 cm module with close packing of subcells, 4,335 W of heat will be generated in the CPV device. For ease of calculations, it is assumed that approximately 5 kWt of heat needs to be removed in a 5 kWe CPV device.

Air, water or other cooling systems may be used to dissipate the resultant heat in the CPV device. In one embodiment, an air cooling system may involve an air curtain that efficiently drives air over the CPV device through a linear array of small high-intensity fans. In other embodiments, integrated water cooling in the shadow of the subcell's busbars may be used so as not to obscure the transmission of infrared light through the CPV device. As previously described, a water curtain may be used if the cooling fluid has very low absorption of out of band light. If subcells are spaced sufficiently apart in the module and heat can be dissipated in the substrate, active cooling may not be necessary, and passive cooling will suffice.

The transmissive CPV device operates at about 110 degrees Celsius or below. This is an important distinction from other technologies that couple CPV with solar thermal energy generation, where the excess heat generated by the CPV is directly harvested, and the CPV operates at much higher temperatures (e.g. 200 degrees Celsius or above), or the thermal energy generation is at much lower temperatures (e.g., 200 degrees Celsius or below). The present invention can attain temperatures approaching 600 degrees Celsius or even higher in the thermal storage medium. In those coupled thermal energy harvesting systems, fluid is directed near the CPV to extract heat directly into the thermal energy generation and storage system. The downside of this approach is that the CPV operates with significantly reduced performance at high temperatures, and the system is much less efficient than the system proposed here. The transmissive CPV of the present invention operates at about 110 C or below and is designed to keep the CPV device thermally isolated from the thermal storage device, which in turn can operate at its preferred, much higher, temperatures for optimal thermal storage and energy conversion to electricity.

What is claimed is:

1. A concentrated photovoltaic thermal system, comprising:
a concentrator for focusing sunlight into concentrated sunlight;
a transmissive concentrated photovoltaic (CPV) module having:
a superstrate composed of a material transmissive to visible and infrared light, the superstrate facing the concentrator such that the concentrated sunlight is transmitted through the superstrate;
a substrate composed of a material transmissive to infrared light; and
photovoltaic cells for absorbing, and converting into electrical energy, a first portion of the concentrated sunlight, the photovoltaic cells being located between the substrate and the superstrate;
wherein a second portion of the concentrated sunlight that is unabsorbed by the photovoltaic cells exits the transmissive CPV module via the substrate; and
a thermal receiver for absorbing, and converting into thermal energy, the second portion of the concentrated sunlight, the thermal receiver forming an input aperture that faces the substrate to receive the second portion of the concentrated sunlight;
wherein the thermal receiver and transmissive CPV module are thermally isolated from each other to reduce heat flow therebetween.

2. The concentrated photovoltaic thermal system of claim 1, the input aperture being planar.

3. The concentrated photovoltaic thermal system of claim 1, the input aperture being located near a focal point of the concentrator.

4. The concentrated photovoltaic thermal system of claim 1, the thermal receiver being positioned such that an area of the input aperture is greater than a spot size of the concentrated sunlight.

5. The concentrated photovoltaic thermal system of claim 1, wherein all of the photovoltaic cells lie within an area that is less than a spot size of the concentrated sunlight.

6. The concentrated photovoltaic thermal system of claim 1, the concentrator being one of a reflector dish and a lens.

7. The concentrated photovoltaic thermal system of claim 1, wherein each of the photovoltaic cells being a multijunction photovoltaic cell.

8. The concentrated photovoltaic thermal system of claim 1, the photovoltaic cells being arranged in a two-dimensional array.

9. The concentrated photovoltaic thermal system of claim 1, wherein:
the superstrate has opposing first and second surfaces;
the substrate has opposing third and fourth surfaces;
the photovoltaic cells are located between the second and third surfaces; and
the concentrated photovoltaic thermal system further comprises one or both of:
a first antireflective coating, located on the first surface, for enhancing transmission of visible and infrared light into the superstrate; and
a second antireflective coating, located on the fourth surface, for enhancing transmission of infrared light out of the substrate.

10. The concentrated photovoltaic thermal system of claim 9, further comprising one or both of:
a third antireflective coating, located on an input face of each of the photovoltaic cells, for enhancing transmission of visible and infrared light into said each of the photovoltaic cells; and
a fourth antireflective coating, located on an output face of each of the photovoltaic cells, for enhancing transmission of infrared light out of the said each of the photovoltaic cells.

11. A method for concentrated photovoltaic thermal energy conversion, comprising:
focusing, with a concentrator, sunlight into concentrated sunlight;
transmitting the concentrated sunlight through a superstrate of a transmissive CPV module that faces the concentrator, the superstrate being composed of a material transmissive to visible and infrared light;
absorbing and converting into electrical energy, with photovoltaic cells of the transmissive CPV module, a first portion of the concentrated sunlight transmitted through the superstate;
transmitting, through a substrate of the transmissive CPV module that is composed of a material transmissive to infrared light, a second portion of the concentrated sunlight that is unabsorbed by the photovoltaic cells, the photovoltaic cells being located between the superstrate and the substrate;
absorbing and converting into thermal energy, with a thermal receiver, the second portion of the concentrated sunlight, the thermal receiver forming an input aperture that faces the substrate to receive the second portion of the concentrated sunlight; and
thermally isolating the thermal receiver and the transmissive CPV module from each other to reduce heat flow therebetween.

12. The method of claim 11, a maximum temperature of the photovoltaic cells being less than a maximum temperature of the thermal receiver.

13. The method of claim 12, the maximum temperature of the photovoltaic cells being 110 degrees Celsius, or less.

14. The method of claim 12, the maximum temperature of the thermal receiver being 250 degrees Celsius, or higher.

15. The method of claim 11, a concentration of the concentrated sunlight being 300 to 500 suns.

16. The method of claim 11, the input aperture being planar.

17. The method of claim 11, further comprising positioning the thermal receiver such that the input aperture is located near a focal point of the concentrator.

18. The method of claim 11, wherein said focusing with the concentrator includes focusing with one of a reflector dish and a lens.

19. The method of claim 11, wherein:
the superstrate has opposing first and second surfaces;
the substrate has opposing third and fourth surfaces;
the photovoltaic cells are located between the second and third surfaces; and
the method further comprises one or both of:
transmitting the concentrated sunlight through a first antireflective coating located on the first surface of the superstrate; and
transmitting the second portion of the concentrated sunlight through a second antireflective coating located on the fourth surface of the substrate.

20. The method of claim 19, further comprising one or both of:

transmitting the concentrated sunlight through a third antireflective coating located on an input face of each of the photovoltaic cells; and transmitting the second portion of the concentrated sunlight through a fourth antireflective coating located on an output face of each of the photovoltaic cells.

* * * * *